(12) United States Patent
Uchida et al.

(10) Patent No.: US 8,124,984 B2
(45) Date of Patent: Feb. 28, 2012

(54) SEMICONDUCTOR MULTILAYER STRUCTURE ON AN OFF-CUT SEMICONDUCTOR SUBSTRATE

(75) Inventors: Masao Uchida, Hyogo (JP); Kazuya Utsunomiya, Osaka (JP); Koichi Hashimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 217 days.

(21) Appl. No.: 12/665,556

(22) PCT Filed: May 11, 2009

(86) PCT No.: PCT/JP2009/002044
§ 371 (c)(1),
(2), (4) Date: Dec. 18, 2009

(87) PCT Pub. No.: WO2009/139140
PCT Pub. Date: Nov. 19, 2009

(65) Prior Publication Data
US 2010/0193800 A1    Aug. 5, 2010

(30) Foreign Application Priority Data
May 13, 2008   (JP) ................................. 2008-126399

(51) Int. Cl.
*H01L 29/04* (2006.01)
(52) U.S. Cl. .................................. 257/77; 257/E29.104
(58) Field of Classification Search ..................... 257/77, 257/E29.104
See application file for complete search history.

(56) References Cited

U.S. PATENT DOCUMENTS

| | | | |
|---|---|---|---|
| 6,573,534 | B1 | 6/2003 | Kumar et al. |
| 2006/0027833 | A1* | 2/2006 | Tanimoto ...................... 257/173 |
| 2009/0101918 | A1 | 4/2009 | Uchida et al. |

FOREIGN PATENT DOCUMENTS

| | | |
|---|---|---|
| JP | 08-298320 | 11/1996 |
| JP | 11-186402 | 7/1999 |

(Continued)

OTHER PUBLICATIONS

International Search Report for corresponding application No. PCT/JP2009/002044 dated Aug. 11, 2009.

*Primary Examiner* — Wensing Kuo
(74) *Attorney, Agent, or Firm* — Renner, Otto, Boisselle & Sklar, LLP

(57) ABSTRACT

A semiconductor device is fabricated on an off-cut semiconductor substrate 11. Each unit cell 10 thereof includes: a first semiconductor layer 12 on the surface of the substrate 11; a second semiconductor layer 16 stacked on the first semiconductor layer 12 to have an opening 16e that exposes first and second conductive regions 15 and 14 at least partially; a first conductor 19 located inside the opening 16e of the second semiconductor layer 16 and having a conductive surface 19s that contacts with the first and second conductive regions 15 and 14; and a second conductor 17 arranged on the second semiconductor layer 16 and having an opening 18e corresponding to the opening 16s of the second semiconductor layer 16. In a plane that is defined parallel to the surface of the substrate 11, the absolute value of a difference between the respective lengths of the second semiconductor layer 16 and the second conductor 18 as measured in the off-cut direction is greater than the absolute value of their difference as measured perpendicularly to the off-cut direction.

26 Claims, 16 Drawing Sheets

FOREIGN PATENT DOCUMENTS

| | | |
|---|---|---|
| JP | 11-274173 | 10/1999 |
| JP | 11-330091 | 11/1999 |
| JP | 2001-133955 | 5/2001 |
| JP | 2007-053226 | 3/2007 |
| JP | 2007-141940 | 6/2007 |
| JP | 2007-280978 | 10/2007 |
| JP | 2007-281157 | 10/2007 |
| JP | 2008-053363 | 3/2008 |
| JP | 2008-311261 | 12/2008 |
| WO | WO 2007135940 A1 * | 11/2007 |

* cited by examiner (a)

SEMICONDUCTOR MULTILAYER STRUCTURE ON AN OFF-CUT SEMICONDUCTOR SUBSTRATE

TECHNICAL FIELD

The present invention relates to a semiconductor device and a semiconductor wafer.

BACKGROUND ART

Silicon carbide (SiC) is a high-hardness semiconductor material with a greater bandgap than silicon (Si), and has been used extensively in various types of semiconductor devices including power elements, hostile-environment elements, high temperature operating elements, and radio frequency elements. Among other things, the application of SiC to power elements such as switching elements and rectifiers has attracted a lot of attention. This is because a power element that uses SiC can significantly reduce the power loss compared to a Si power element.

Among various power elements that use SiC, switching elements such as a MOSFET and a MESFET are known as typical ones. Such a switching element can switch between ON state in which drain current of several amperes (A) or more flows and OFF state in which the drain current becomes zero by changing the voltages applied to its gate electrode. Also, in the OFF state, SiC will achieve as high a breakdown voltage as several hundred volts or more. For example, Patent Document No. 1 proposes a structure for a vertical MOSFET that uses SiC.

A power element such as a MOSFET or a MESFET is generally made of semiconductor layers that have been stacked on a semiconductor substrate such as an SiC substrate and is made up of a lot of unit cells. As disclosed in Patent Documents Nos. 1 and 2, those unit cells are often arranged two-dimensionally in an X direction and in a Y direction that intersects with the X direction at right angles. Such an arrangement is adopted to maximize the current density of the power element. Also, in a power element such as a MOSFET, a MESFET, an IGBT or a JFET in which the ON and OFF states of current are changed by controlling the channel width using a gate electrode or a base electrode, the channel width per unit area is preferably maximized with the size of a unit cell minimized. Then, the effective channel width, which is the sum of the respective channel widths of all unit cells, can be increased. As a result, the ON-state resistance of the power element can be reduced.

Hereinafter, the relation between a semiconductor substrate in the shape of a wafer (i.e., a semiconductor wafer) and unit cells to be vertical MOSFETs will be described as an example with reference to the accompanying drawings. FIG. 13(a) is a schematic plan view illustrating the semiconductor wafer, while FIGS. 13(b) through 13(d) are schematic enlarged plan views illustrating portions of the semiconductor wafer.

As shown in FIG. 13(a), the semiconductor wafer 100 (which will be referred to herein as a "semiconductor bulk substrate" to identify it from semiconductor substrates obtained by dicing the wafer into respective devices) has repeat units called "shot regions 110", each of which is a region corresponding to one shot of a stepper and may have a size of 15 mm square, for example. And in each shot region 110, a number of semiconductor devices 130 (which are vertical MOSFETs in this example) are arranged efficiently as shown in FIG. 13(b). Each semiconductor device 130 may have a size of 3.5 mm square. In this example, 16 semiconductor devices 130 are arranged in each shot region 110 to form a four-by-four array in X and Y directions. Also, in the boundary between adjacent devices 130, arranged is an alignment pattern 120 for use to make mask alignment in a photolithographic process.

As shown in FIG. 13(c), each semiconductor device 130 includes a source pad 1C and a gate pad 1G. If necessary, each semiconductor device 130 is surrounded with a terminal structure (such as a guard ring, a guard band or a mesa structure) for minimizing a decrease in breakdown voltage around the semiconductor device 130. And each semiconductor device 130 consists of a number of unit cells 500 as shown in FIG. 3(d). Those unit cells 500 are arranged in parallel with each other under the source pad 1C of the semiconductor device 130. Although not shown, the respective source electrodes of those unit cells 500 are electrically connected to the source pad 1C, while the respective gate electrodes of the unit cells 500 are electrically connected to the gate pad 1G. In this example, each unit cell 500 has a square shape in a plan view. But each unit cell 500 may have a hexagonal shape or any other shape. Also, in this example, the unit cells 500 are arranged straight in the Y direction and shifted from each other by a half pitch in the x direction. Alternatively, the unit cells 500 may also be arranged in a matrix pattern.

FIG. 14 is a schematic top view illustrating a single unit cell 500. As described above, the unit cell 500 is covered with a source pad 1C (which will also be referred to herein as an "upper interconnect electrode"). Although not shown, a source electrode is arranged under the upper interconnect electrode 1C with a dielectric film interposed between them. The source electrode and the upper interconnect electrode 1C are electrically connected together through a hole that has been cut through the dielectric film. The source electrode has a conductive surface 19s that makes electrical contact with a contact region 15 of a semiconductor layer (not shown) and with a source region (not shown, either) surrounding the contact region 15. Under the dielectric film, also arranged are a channel layer and a gate electrode. The channel layer has been patterned so as to have a square opening indicated by the square 16e and the gate electrode has been patterned so as to have a square opening indicated by the square 18e. Also, in the conventional unit cell 500, the conductive surface 19s of the source electrode, the contact region 15, the opening 18e of the gate electrode, the opening 16e of the channel layer, and the unit cell 500 all have similar shapes. Thus, in the example illustrated in FIG. 14, the unit cell 500 has a square planar shape and its lengths xoc and yoc in the X and Y directions satisfy xoc=yoc. The cross-sectional shape of the conventional unit cell 500 will be described in detail later.

As described above, to ensure a sufficient effective channel width, the number of devices that are integrated together in a unit area is preferably increased by reducing the size of each unit cell 500. However, the size of each unit cell 500 cannot be reduced unlimitedly but is determined with the alignment accuracy in fabricating the semiconductor device 130 (which will also be referred to herein as "mask alignment accuracy") and the size difference taken into consideration.

Among these factors, the "size difference" arises if the size defined by a photomask for use in a photolithographic process step during the manufacturing process of the semiconductor device 130 (which will be referred to herein as a "photomask size") is different from that of a developed photoresist mask (which will be referred to herein as a "resist size") or if the size of an actual structure that has been obtained as a result of an etching process step using the photoresist mask is different from the photomask size. Such a size difference could be made up by optimizing some process condition such as the photomask size or an exposure condition.

Therefore, the size of each unit cell 500 is determined mainly by the "alignment accuracy". Each set of process equipment for use to fabricate the semiconductor device 130 (and an exposure system for use in the photolithographic process, in particular) has its own "alignment accuracy". That is to say, the alignment accuracy varies from one set of equipment to another. In general, a stepper for use to make an SiC device will have an alignment accuracy $\Delta$ of approximately 0.1 to 0.2 µm, and the alignment error (which will be simply referred to herein as "misalignment") could occur within the range of $\pm\Delta$. As used herein, the "misalignment" refers to the shift of the location of an electrode or a doped region, which is going to be defined by performing an etching or ion implantation process step, from their designed one due to the misalignment of the photomask from the photoresist film as viewed perpendicularly to the semiconductor wafer. That is why the respective dimensions of the semiconductor device 130 should be determined with a margin that is broad enough to avoid short-circuit or contact failure between electrodes even if the misalignment occurred. As a result, the size of the unit cell 500 is restricted.

Ideally, the exposure system such as a stepper for use in the photolithographic process step preferably has the same degree of alignment accuracy in both of the X and Y directions. That is why on the supposition that the misalignment will occur at almost the same probability in the X and Y directions in each unit cell 500, conventional devices are designed such that the margins as measured in the X and Y directions (i.e., the absolute values of the differences in length between the two structures) become equal to each other as can be seen from FIG. 14.

Hereinafter, it will be described how to make mask alignment (i.e., how to determine the location of a photomask) in fabricating the semiconductor device 130.

The mask alignment is carried out on a shot region (110, see FIG. 13(*b*)) basis by using the alignment pattern 120 that has been defined in that shot region 110.

FIGS. 15(*a*) and 15(*b*) are respectively a plan view and a schematic cross-sectional view illustrating the alignment pattern 120. As shown in FIG. 15(*b*), the alignment pattern 120 has been defined on the surface of the semiconductor layer 12 that has been deposited on the semiconductor wafer 11. In this example, the alignment pattern 120 has a number of recesses 121 that function as markers (which will be simply referred to herein as "markers"). In the semiconductor layer 12, there is a level difference of approximately 0.3 µm, for example, between portions with the markers 121 and the other portions with no markers 121. If another film is deposited on this semiconductor layer 12, then that another film will also have recesses in the same shape as the markers 121 of the semiconductor layer 12. Thus, in that case, the photolithographic process step is carried out by using those recesses as markers.

If a semiconductor film is grown as that another film on the semiconductor layer 12 with those markers 121, however, the markers could get blunted, and could become difficult to recognize, according to the method of growing that semiconductor film.

Hereinafter, such a problem will be discussed in detail with reference to FIGS. 16(*a*) and 16(*b*) as to a process of fabricating a vertical MOSFET using a silicon carbide (SiC) layer as the semiconductor layer 12.

In a vertical MOSFET, a channel layer is sometimes formed on the semiconductor layer 12 (which is a silicon carbide layer in this example) by epitaxial growth process in order to increase the channel mobility. In that case, an additional epitaxial layer 16' (which will be referred to herein as an "extra epi-layer") is grown on the semiconductor layer 12 with the markers 121, thereby obtaining a channel layer as shown in FIGS. 16(*a*) and 16(*b*). The extra epi-layer 16' has recesses 122 corresponding to the markers 121. And those recesses 122 will be used as markers in subsequent process steps. However, the shape of the recesses 122 could be significantly different from that of the markers 121 in the semiconductor layer 12 as shown in FIG. 16(*a*).

A vertical MOSFET of SiC often uses an off-cut wafer as the semiconductor wafer 11. As used herein, the "off-cut wafer" is a wafer, of which the principal surface is tilted by several degrees toward a predetermined direction (which will be referred to herein as an "off-cut direction") with respect to the basal crystal plane (which may be a (0001) plane, for example). On such an off-cut wafer, the semiconductor layer 12 is formed by step flow growth process. Thus, the extra epi-layer 16' to be grown epitaxially on that surface is also formed by the step flow growth process. As a result, the extra epi-layer 16' is not deposited isotropically with respect to the markers 121 but the markers 121 of the semiconductor layer 12 could be deformed through the step flow growth process into crater recesses 122 with a crescent cross section as shown in FIG. 16(*b*). The arrow Y shown in FIG. 16(*b*) indicates the direction in which the step flow growth occurs on the semiconductor layer 12 and on the extra-epi layer 16', and is the direction defined by projecting the off-cut direction of the semiconductor wafer 11 onto a virtual plane that is parallel to the surface of the semiconductor wafer 11 (i.e., the off-cut direction within the plane of the semiconductor wafer 11). On the other hand, the arrow X indicates the direction that is perpendicular to the Y direction within the virtual plane of the semiconductor wafer 11.

Those recesses 122 with the crescent cross section are symmetrical with respect to the line A-A' that runs parallel to the Y direction but are not symmetrical with respect to a line that runs parallel to the X direction. If such recesses 122 were used as markers in a photolithographic process step to be carried out after the extra-epi layer 16' has been deposited, then it would be too difficult to get mask alignment done in the Y direction, in particular, to maintain sufficient mask alignment accuracy. In that case, a significant misalignment that is greater than the alignment accuracy $\Delta$ described above could occur in the Y direction when a channel layer is formed by patterning the extra epi-layer 16' or when a dielectric film or some structure such as a source electrode or a gate electrode is formed after the extra-epi layer 16' has been deposited. Once such a significant misalignment occurred, the characteristics of the device could deteriorate due to short-circuit or contact failure between electrodes or an increase in resistance.

To overcome such a problem, Patent Document No. 3 proposes that the deformation of alignment marks be minimized by leaving the alignment marks on {0001} planes of an epitaxial layer that has been grown on an off-cut substrate and then growing an extra-epi layer. On the other hand, Patent Document No. 4 proposes that the deformation of alignment marks with a groove be minimized by covering the groove with a carbon film.

Furthermore, Patent Document No. 5, which was filed by the applicant of the present application, proposes that alignment marks be formed as a difference in surface roughness on an extra-epi layer by forming an undercoat pattern on the epitaxial layer with the dopant concentration varied and then growing the extra-epi layer on that undercoat pattern.

CITATION LIST

Patent Literature

Patent Document No. 1: Japanese Patent Application Laid-Open Publication No. 2007-141940
Patent Document No. 2: Japanese Patent Application Laid-Open Publication No. 8-298320
Patent Document No. 3: Japanese Patent Application Laid-Open Publication No. 2007-280978
Patent Document No. 4: Japanese Patent Application Laid-Open Publication No. 2007-281157
Patent Document No. 5: Japanese Patent Application Laid-Open Publication No. 2008-053363

DISCLOSURE OF INVENTION

Problems to be Solved by the Invention

As mentioned above, Patent Documents Nos. 3 to 5 do propose various techniques for increasing, after an extra-epi layer has been formed, the mask alignment accuracy by leaving a highly recognizable alignment pattern on the extra-epi layer. However, none of those documents disclose any technique for minimizing the influence of a decreased degree of recognizability on the device characteristics while using a conventional alignment pattern.

It is therefore an object of the present invention to minimize the deterioration of the characteristics (such as short-circuit or contact failure between electrodes or an increase in ON-state resistance) of a semiconductor device with a semiconductor multilayer structure on an off-cut semiconductor substrate even if misalignment has occurred due to a decrease in the degree of recognizability of an alignment pattern for use to fabricate such a device.

Means for Solving the Problems

A semiconductor device according to the present invention includes a number of unit cells that have been formed on an off-cut semiconductor substrate, of which the principal surface is defined by tilting a crystal plane in a predetermined off-cut direction. Each unit cell includes: a first semiconductor layer, which has been formed on the principal surface of the off-cut semiconductor substrate; a first conductive region, which has been defined on the surface of the first semiconductor layer so as to have a first conductivity type; a second conductive region, which has been defined on the surface of the first semiconductor layer so as to surround the first conductive region and to have a second conductivity type that is different from the first conductivity type; a second semiconductor layer, which has been stacked on the first semiconductor layer so as to have an opening that exposes the first and second conductive regions at least partially; a first conductor, which is located inside the opening of the second semiconductor layer and which has a conductive surface that contacts with the first and second conductive regions; and a second conductor, which is arranged on the second semiconductor layer and which has an opening corresponding to that of the second semiconductor layer. In a plane that is defined parallel to the principal surface of the off-cut semiconductor substrate, the absolute value $t_y$ of a difference between the respective lengths of the second semiconductor layer and the second conductor as measured in the off-cut direction is greater than the absolute value $t_x$ of their difference as measured perpendicularly to the off-cut direction. And the absolute value $s_y$ of a difference between the respective lengths of the conductive surface of the first conductor and the opening of the second semiconductor layer as measured in the off-cut direction and the absolute value $s_x$ of their difference as measured perpendicularly to the off-cut direction satisfy the inequality $t_y - t_x > s_y - s_x$.

Another semiconductor device according to the present invention includes a number of unit cells that have been formed on an off-cut semiconductor substrate, of which the principal surface is defined by tilting a crystal plane in a predetermined off-cut direction. Each unit cell includes: a first semiconductor layer, which has been formed on the principal surface of the off-cut semiconductor substrate; a first conductive region, which has been defined on the surface of the first semiconductor layer so as to have a first conductivity type; a second conductive region, which has been defined on the surface of the first semiconductor layer so as to surround the first conductive region and to have a second conductivity type that is different from the first conductivity type; a second semiconductor layer, which has been stacked on the first semiconductor layer so as to have an opening that exposes the first and second conductive regions at least partially; a first conductor, which is located inside the opening of the second semiconductor layer and which has a conductive surface that contacts with the first and second conductive regions; and a second conductor, which is arranged on the second semiconductor layer and which has an opening corresponding to that of the second semiconductor layer. In a plane that is defined parallel to the principal surface of the off-cut semiconductor substrate, the absolute value $u_y$ of a difference between the respective lengths of the conductive surface of the first conductor and the first conductive region as measured in the off-cut direction is greater than the absolute value $u_x$ of their difference as measured perpendicularly to the off-cut direction. The absolute value $s_y$ of a difference between the respective lengths of the conductive surface of the first conductor and the opening of the second semiconductor layer as measured in the off-cut direction and the absolute value $s_x$ of their difference as measured perpendicularly to the off-cut direction satisfy the inequality $u_y - u_x > s_y - s_x$.

In one preferred embodiment, $s_y$ and $s_x$ are substantially equal to each other.

In another preferred embodiment, in a plane that is defined parallel to the principal surface of the off-cut semiconductor substrate, the absolute values $u_y$ and $u_x$ of differences between the respective lengths of the conductive surface of the first conductor and the first conductive region as measured in the off-cut direction and as measured perpendicularly to the off-cut direction, respectively, satisfy the inequality $t_y - t_x > u_y - u_x$.

In still another preferred embodiment, the absolute values $v_y$ and $v_x$ of differences between the respective lengths of the conductive surface of the first conductor and the opening of the second conductor as measured in the off-cut direction and as measured perpendicularly to the off-cut direction, respectively, satisfy the inequality $u_y - u_x > v_y - v_x$.

In yet another preferred embodiment, the semiconductor device may have a transistor structure and the second semiconductor layer may function as a channel layer.

In this particular preferred embodiment, the first and second semiconductor layers may be epitaxial layers.

In yet another preferred embodiment, the semiconductor device may further include an insulating film between the channel layer and the second conductor.

In this particular preferred embodiment, the first semiconductor layer has the second conductivity type. Each unit cell is electrically connected to the first conductive region and further includes a well region of the first conductivity type, which surrounds the second conductive region on the surface of the first semiconductor layer.

In a specific preferred embodiment, the semiconductor device may further include: a drain electrode, which is arranged on the other side of the off-cut semiconductor substrate opposite to the first semiconductor layer and which is electrically connected to the off-cut semiconductor substrate; a dielectric film, which has been deposited over the second conductor; and an upper interconnect electrode, which is arranged on the dielectric film. The dielectric film has an opening that exposes the first conductor. The upper interconnect electrode is electrically connected to the first conductor through the opening of the dielectric film.

The second semiconductor layer preferably includes silicon carbide.

The first semiconductor layer preferably includes silicon carbide, too.

A semiconductor wafer according to the present invention includes: a semiconductor bulk substrate, of which the principal surface is defined by tilting a crystal plane in a predetermined off-cut direction; a semiconductor layer, which has been formed on the semiconductor bulk substrate; a number of semiconductor devices, which have been fabricated using the semiconductor layer; and an alignment pattern, which is left on at least a part of the rest of the semiconductor layer that is not covered with the semiconductor devices. Each of the semiconductor devices is designed as a device according to any of the preferred embodiments of the present invention described above.

Still another semiconductor device according to the present invention includes: an off-cut semiconductor substrate, of which the principal surface is defined by tilting a crystal plane in a predetermined off-cut direction; a first semiconductor layer, which has been formed on the principal surface of the off-cut semiconductor substrate; a second semiconductor layer, which has been stacked on the first semiconductor layer so as to have an opening that exposes the surface of the first semiconductor layer at least partially; a first conductor, which is located inside the opening of the second semiconductor layer and which has a conductive surface that contacts with the exposed surface of the first semiconductor layer; and a second conductor, which is arranged on the second semiconductor layer and which has an opening corresponding to that of the second semiconductor layer. In a plane that is defined parallel to the principal surface of the off-cut semiconductor substrate, the absolute value $t_y$ of a difference between the respective lengths of those openings of the second semiconductor layer and the second conductor as measured in the off-cut direction is greater than the absolute value $t_x$ of their difference as measured perpendicularly to the off-cut direction. The absolute value $s_y$ of a difference between the respective lengths of the conductive surface of the first conductor and the opening of the second semiconductor layer as measured in the off-cut direction and the absolute value $s_x$ of their difference as measured perpendicularly to the off-cut direction satisfy the inequality $t_y-t_x>s_y-s_x$.

Yet another semiconductor device according to the present invention includes: an off-cut semiconductor substrate, of which the principal surface is defined by tilting a crystal plane in a predetermined off-cut direction; a first semiconductor layer, which has been formed on the principal surface of the off-cut semiconductor substrate; a first conductive region, which has been defined on the surface of the first semiconductor layer so as to have a first conductivity type; a second conductive region, which has been defined on the surface of the first semiconductor layer so as to surround the first conductive region and to have a second conductivity type that is different from the first conductivity type; a second semiconductor layer, which has been stacked on the first semiconductor layer so as to have an opening that exposes the first and second conductive regions at least partially; and a first conductor, which is located inside the opening of the second semiconductor layer and which has a conductive surface that contacts with the first and second conductive regions. In a plane that is defined parallel to the principal surface of the off-cut semiconductor substrate, the absolute value $u_y$ of a difference between the respective lengths of the conductive surface of the first conductor and the first conductive region as measured in the off-cut direction is greater than the absolute value $u_x$ of their difference as measured perpendicularly to the off-cut direction. The absolute value $s_y$ of a difference between the respective lengths of the conductive surface of the first conductor and the opening of the second semiconductor layer as measured in the off-cut direction and the absolute value $s_x$ of their difference as measured perpendicularly to the off-cut direction satisfy the inequality $u_y-u_x>s_y-s_x$.

In one preferred embodiment, $s_y$ and $s_x$ are substantially equal to each other.

EFFECTS OF THE INVENTION

According to the present invention, in a semiconductor device that has a multilayer structure including first and second semiconductor layers on an off-cut semiconductor substrate, the margin (i.e., the difference in length) is increased in the off-cut direction either between the second semiconductor layer and the second conductor or between the conductive surface of the first conductor and the first conductive region. Then, even if any misalignment has occurred due to a decrease in the recognizability of an alignment pattern caused by the deposition of the second semiconductor layer, various kinds of deterioration in device characteristics, including short-circuit or contact failure between electrodes and an increase in ON-state resistance, can be minimized. As a result, a highly reliable semiconductor device can be provided.

In addition, the semiconductor device of the present invention can be fabricated by a similar process to the conventional one without performing any additional process for checking the decrease in the recognizability of the alignment pattern.

Furthermore, the semiconductor device of the present invention is preferably designed such that when multiple elements of the semiconductor device are stacked one upon the other, only some of those elements to be formed after the alignment pattern has been deformed due to the deposition of the second semiconductor layer have their margin increased in the predetermined direction. As a result, deterioration in device characteristics due to the deformation of the alignment pattern can be minimized without significantly decreasing the packing density of unit cells on the wafer.

BRIEF DESCRIPTION OF DRAWINGS

FIGS. 1(a) through 1(c) are schematic representations illustrating a semiconductor device as a first preferred embodiment of the present invention, wherein FIG. 1(a) is a plan view illustrating a unit cell of the semiconductor device, and FIGS. 1(b) and 1(c) are cross-sectional views of the unit cell as viewed on the planes Ib-Ib' and Ic-Ic', respectively.

FIGS. 2(a) through 2(d) illustrate the relation between an off-cut semiconductor substrate according to a preferred embodiment of the present invention and unit cells, wherein FIG. 2(a) is a plan view of the semiconductor bulk substrate, FIG. 2(b) is a plan view illustrating one of the shot regions thereof, FIG. 2(c) is a plan view illustrating a single semiconductor device, and FIG. 2(d) is an enlarged plan view illustrating a portion of the semiconductor device.

FIGS. 7(a) through 7(c) are schematic representations illustrating a semiconductor device as a second preferred embodiment of the present invention, wherein FIG. 7(a) is a plan view illustrating a unit cell of the semiconductor device, and FIGS. 7(b) and 7(c) are cross-sectional views of the unit cell as viewed on the planes VIIb-VIIb' and VIIc-VIIc', respectively.

FIGS. 9(a) through 9(c) are schematic representations illustrating another semiconductor device as a modified example of the second preferred embodiment of the present invention, wherein FIG. 9(a) is a plan view illustrating a unit cell of the semiconductor device, and FIGS. 9(b) and 9(c) are cross-sectional views of the unit cell as viewed on the planes Ib-Ib' and Ic-Ic', respectively.

FIGS. 13(a) through 13(d) illustrate the relation between a conventional off-cut semiconductor substrate and unit cells, wherein FIG. 13(a) is a plan view illustrating a semiconductor bulk substrate, FIG. 13(b) is a plan view illustrating one of its shot regions, FIG. 13(c) is a plan view illustrating one of its semiconductor devices, and FIG. 13(d) is an enlarged plan view illustrating a portion of the semiconductor device.

BEST MODE FOR CARRYING OUT THE INVENTION

Embodiment 1

Hereinafter, a first preferred embodiment of a semiconductor device according to the present invention will be described with reference to FIGS. 1 and 2. The semiconductor device of this preferred embodiment is a vertical MOSFET that has been fabricated on an off-cut semiconductor substrate, and typically consists of a number of unit cells that are arranged two-dimensionally.

Figure 1:
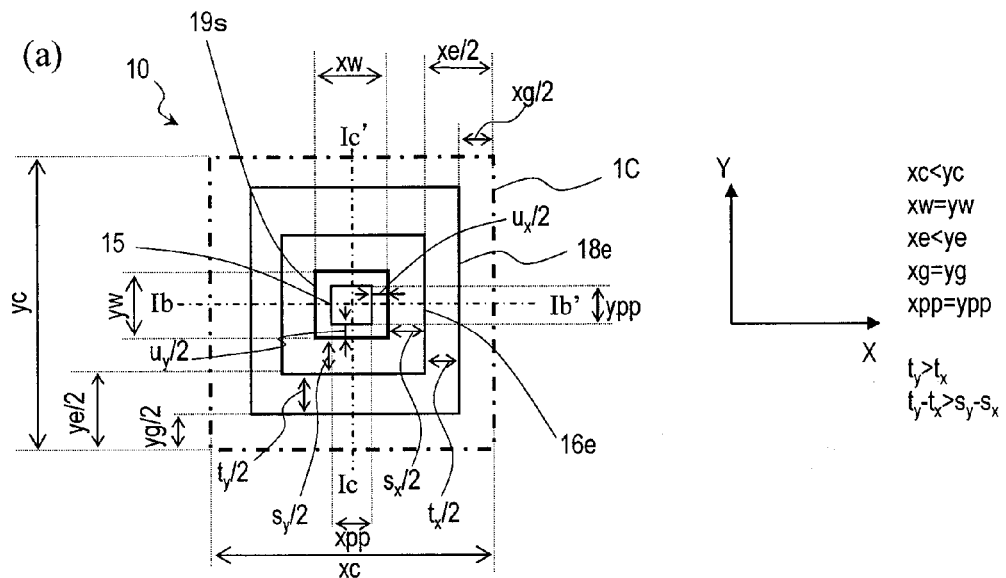
Figure 1:
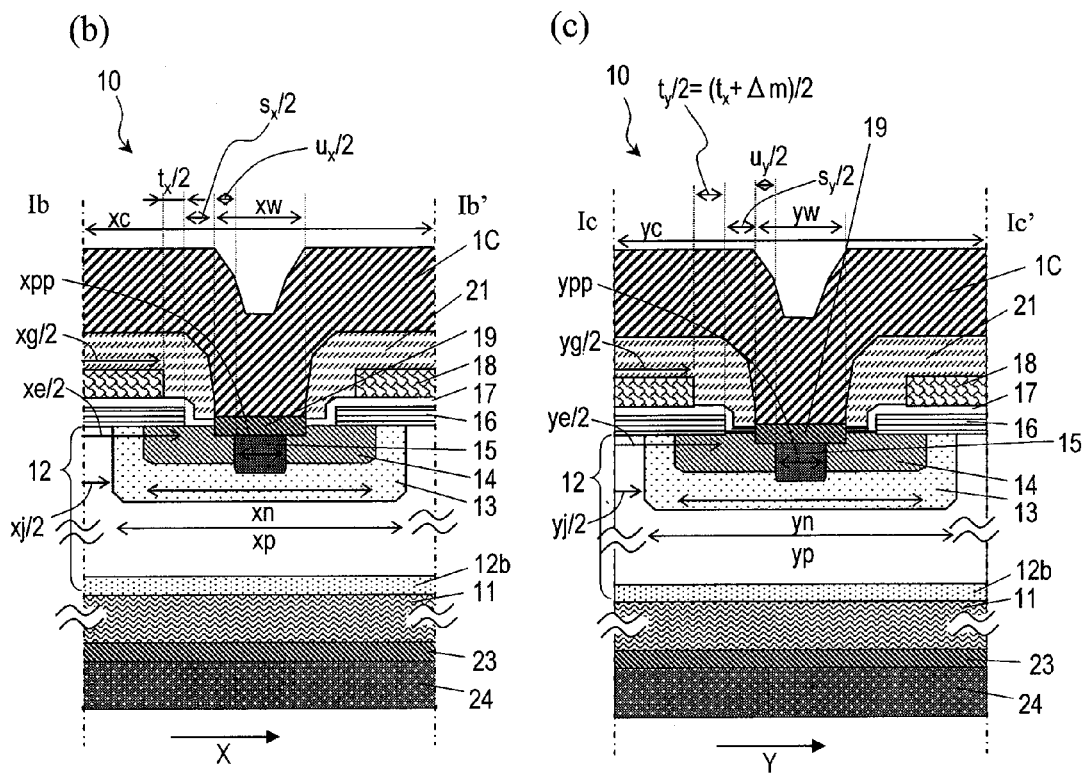
Figure 2:
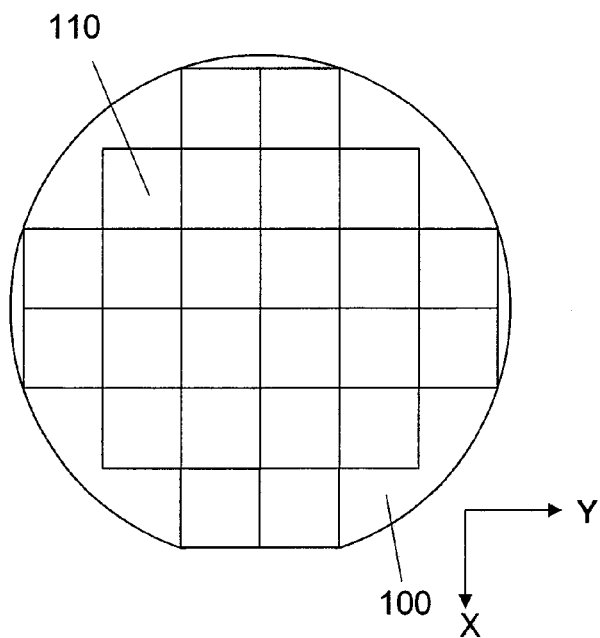
Figure 2:
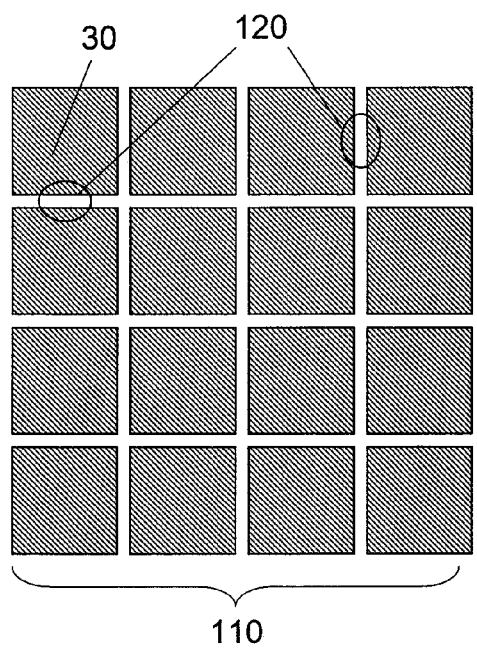
Figure 2:
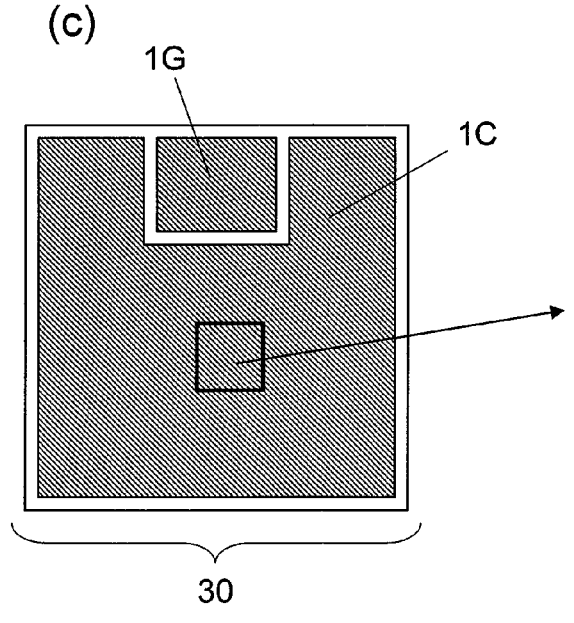
Figure 2:
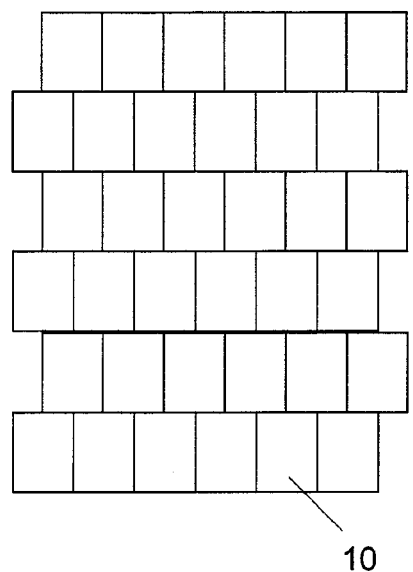

FIGS. 1(a) through 1(c) are schematic representations illustrating a unit cell of the semiconductor device of the first preferred embodiment. Specifically, FIG. 1(a) is a plan view illustrating a unit cell of the semiconductor device of this preferred embodiment, FIG. 1(b) is a cross-sectional view of the unit cell as viewed on the plane Ib-Ib', and FIG. 1(b) is a cross-sectional view of the unit cell as viewed on the plane Ic-Ic'. On the other hand, FIGS. 2(a) through 2(d) are schematic representations illustrating the relation between a semiconductor substrate in the shape of a wafer (which will be referred to herein as a "semiconductor bulk substrate") according to this preferred embodiment and unit cells. Specifically, FIG. 2(a) is a plan view of the semiconductor bulk substrate, FIG. 2(b) is a plan view illustrating one of the shot regions thereof, FIG. 2(c) is a plan view illustrating a single semiconductor device, and FIG. 2(d) is an enlarged plan view illustrating a portion of the semiconductor device. It should be noted that the planes Ib-Ib' and Ic-Ic' shown in FIG. 1 are parallel to the X and Y directions, respectively, in the semiconductor bulk substrate 100 shown in FIG. 2(a). Any component having the same function as its counterpart shown in FIGS. 13(a) through 13(d) is identified by the same reference numeral for the sake of simplicity, and the description thereof will be omitted herein.

The semiconductor bulk substrate 100 shown in FIG. 2(a) is a semiconductor wafer, of which the principal surface is defined by tilting its crystallographic plane orientation by several degrees from the basal crystal plane (which may be a (0001) plane) toward the off-cut direction. Such a surface will be referred to herein as an "off-cut surface". As used herein, the "off-cut direction" refers to the direction in which the crystallographic plane orientation of the wafer is tilted with respect to the basal crystal plane and which may be a <11-20> direction, for example. Although not shown, the off-cut surface of the semiconductor bulk substrate 100 has a stepped structure with multiple terraces consisting of basal crystal planes. On the off-cut surface, the respective terraces run in one direction (i.e., in the X direction), and steps have been formed perpendicularly to the X direction (i.e., in the Y direction). As used herein, the "Y direction" refers to the off-cut direction within the plane of the semiconductor bulk substrate 100, while the "X direction" refers to the direction that is perpendicular to the Y direction within the plane of the semiconductor bulk substrate 100.

Each shot region 110 of the semiconductor bulk substrate 100 may include 16 semiconductor devices 30 as shown in FIG. 2(b). In the rest of each shot region 110, which is not covered with the semiconductor devices 30, an alignment pattern 120 is left for the purpose of mask alignment. Also, as shown in FIGS. 2(c) and 2(d), each semiconductor device 30 is made up of a lot of unit cells 10 that are arranged in the X and Y directions. As already described with reference to FIG. 13, the planar shape and arrangement of the unit cells 10 are not limited to the illustrated ones.

As shown in FIGS. 1(a) through 1(c), each unit cell includes a semiconductor layer 12 (which is a silicon carbide layer in this example) that has been deposited on an off-cut semiconductor substrate 11 (which will be simply referred to herein as a "semiconductor substrate"), a source electrode 19 that is electrically connected to the semiconductor layer 12, an upper interconnect electrode 1C that is electrically connected to the source electrode 19, a gate electrode 18 that covers the semiconductor layer 12 at least partially, and a drain electrode 23 and a lower interconnect electrode 24 that are electrically connected to the other side of the semiconductor substrate 11. Between the semiconductor layer 12 and the gate electrode 18, a channel layer 16 and a gate insulating film 17 have been stacked in this order. The gate electrode 18 and the upper interconnect electrode 1C are electrically isolated from each other by a dielectric film 21. If necessary, the semiconductor layer 12 may include a buffer layer 12b that contacts with the semiconductor substrate 11.

The semiconductor layer 12 has a p-well region 13 that defines the unit cell 10. Inside the p-well region 13, defined are an n-type source region 14 including an n-type dopant in a high concentration and a p$^+$-type contact region 15 that is electrically connected to the p-well region 13 and that includes a p-type dopant in a higher concentration than the p-well region 13. The n-type source region 14 surrounds the p$^+$-type contact region 15 on the surface of the semiconductor layer 12. The rest of the semiconductor layer 12, other than the p-well region 13, becomes an n-type drift region.

The channel layer 16 may be an n-type epitaxial layer made of 4H—SiC, for example, and is arranged so as to connect the n-type source region 14 to the semiconductor layer 12. The channel layer 16 and the gate electrode 18 have openings 16e and 18e, respectively, that expose a portion of the n-type source region 14 of the semiconductor layer 12 and the p$^+$-type contact region 15 thereof.

The source electrode 19 is arranged inside the openings 16e and 18e of the channel layer 16 and the gate electrode 18 and has a conductive surface 19s that makes ohmic contact with both of the n-type source region 14 and the p$^+$-type contact region 15. In this preferred embodiment, the source electrode 19 is arranged inside the opening of the dielectric film 21.

In this example, suppose, as shown in FIG. 1(b),
xc: the length of the unit cell 10 as measured in the X direction;
xg: the length of the gate electrode 18 as measured in the X direction;
xp: the length of the p-well region 13 as measured in the X direction on the surface of the semiconductor layer 12;
xj: the length of the remaining region, other than the p-well region 13, as measured in the X direction on the surface of the semiconductor layer 12 (i.e., xj=xc−xp);
xn: the length of the n-type source region 14 as measured in the X direction on the surface of the semiconductor layer 12;
xpp: the length of the p$^+$-type contact region 15 as measured in the X direction on the surface of the semiconductor layer 12;
xe: the length of the channel layer 16 as measured in the X direction on the surface of the semiconductor layer 12; and
xw: the length of the conductive surface 19s of the source electrode 19 as measured in the X direction.

It should be noted that even if the source electrode 19 has been extended to reach the upper surface of the dielectric film 21, xw also represents the length of the conductive surface 19s of the source electrode 19, which contacts with the source region and the contact region, as measured in the X direction.

The length xg of the gate electrode 18 is the sum of the distances from both ends of the unit cell 10 to the opening 18e of the gate electrode 18. Likewise, the length xe of the channel layer 16 is the sum of the distances from both ends of the unit cell 10 to the opening 16e of the channel layer 16. Also, if the source electrode 19 is arranged inside the opening of the dielectric film 21 as is done in this preferred embodiment, the length xw of the conductive surface 19s of the source electrode 19 is equal to the length of the opening of the dielectric film 21 as measured in the X direction. Although not shown, the dielectric film 21 could be deposited and an opening could be cut through it after the source electrode 19 has been formed. In that case, the length of the opening of the dielectric film 21 as measured in the X direction is set to be shorter than the length xw of the conductive surface 19s of the source electrode 19 as measured in the X direction.

Furthermore, the absolute value of the difference between the respective lengths of the gate electrode 18 and the channel layer 16 as measured in the X direction is identified by $t_x$. That is to say, $$t_x = |xe - xg|$$

It should be noted that $t_x$ is equal to the absolute value of the difference between the lengths of the respective openings 16e and 18e of the channel layer 16 and the gate electrode 18 as measured in the X direction.

Also, the absolute value of the difference between the length (=xc−xe) of the opening 16e of the channel layer 16 as measured in the X direction and the length xw of the conductive surface 19s of the source electrode 19 as measured in the X direction is identified by $s_x$ and the absolute value of the difference between the respective lengths xw and xpp of the conductive surface 19s and the contact region 15 as measured in the X direction is identified by $u_x$. That is to say, $$s_x = |(xc - xe) - xw|$$

$$u_x = |xw - xpp|$$

In the same way, suppose, as shown in FIG. 1(c),
yc: the length of the unit cell 10 as measured in the Y direction;
yg: the length of the gate electrode 18 as measured in the Y direction;
yp: the length of the p-well region 13 as measured in the Y direction on the surface of the semiconductor layer 12;
yj: the length of the remaining region, other than the p-well region 13, as measured in the Y direction on the surface of the semiconductor layer 12 (i.e., yj=yc−yp);
yn: the length of the n-type source region 14 as measured in the Y direction on the surface of the semiconductor layer 12;
ypp: the length of the p$^+$-type contact region 15 as measured in the Y direction on the surface of the semiconductor layer 12;
ye: the length of the channel layer 16 as measured in the Y direction on the surface of the semiconductor layer 12; and
yw: the length of the conductive surface 19s of the source electrode 19 as measured in the Y direction.

Furthermore, the absolute value of the difference between the respective lengths of the gate electrode 18 and the channel layer 16 as measured in the Y direction is identified by $t_y$. That is to say, $$t_y = |ye - yg|$$

It should be noted that $t_y$ is equal to the absolute value of the difference between the lengths of the respective openings 16e and 18e of the channel layer 16 and the gate electrode 18 as measured in the Y direction.

Also, the absolute value of the difference between the length (=yc−ye) of the opening 16e of the channel layer 16 as measured in the Y direction and the length yw of the conductive surface 19s of the source electrode 19 as measured in the Y direction is identified by $s_y$ and the absolute value of the difference between the respective lengths yw and ypp of the conductive surface 19s and the contact region 15 as measured in the Y direction is identified by $u_y$. That is to say, $$s_y = |(yc - ye) - yw|$$

$$u_y = |yw - ypp|$$

It should be noted that FIGS. 1(a) to 1(c) illustrate a unit cell 10 that has been formed just as designed, i.e., so that the gate electrode 18 and other elements are arranged right at the center of the unit cell 10. Actually, however, due to the misalignment mentioned above, some or all of the elements that have been arranged on the semiconductor layer 12 could shift in the X and/or direction(s) with respect to the semiconductor layer 12. For example, in the unit cell 10 illustrated in FIG. 1, the lengths of two halves the gate electrode 18 as measured from both ends of the unit cell 10 in the X direction are illustrated to be equal to each other and supposed to be xg/2. However, those lengths could be different from each other. Even so, the combined length xg of the gate electrode 18 as measured in the X direction in this unit cell 10 still agrees with the designed value. The same can be said about the other lengths xe, xj, yg, ye, yj, $t_x$, $s_x$, $u_x$, $t_y$, $s_y$ and $u_y$. It should be noted that "both ends of the unit cell 10 (i.e., the periphery of the unit cell 10)" are supposed to be defined based on the well region 13 (or the source region 14 in the device with no well regions 13).

The unit cell 10 of this preferred embodiment is designed so that those lengths as measured in the X and Y directions satisfy the following equations (where Δm>0):

$$yc = xc + \Delta m$$

$$yp = xp + \Delta m$$

$$yj = xj$$

$$yn = xn + \Delta m$$

$$ypp = xpp$$

$$ye = xe + \Delta m$$

$$yg = xg$$

$$yw = xw$$

Therefore, the absolute value $t_y$ of the difference between the respective lengths of the gate electrode 18 and the channel layer 16 as measured in the Y direction is given by $t_x + \Delta m$:

$$t_y = t_x + \Delta m > t_x$$

Thus, the semiconductor device 30 of this preferred embodiment has a greater margin between the gate electrode 18 and the channel layer 16 in the Y direction rather than in the X direction, and therefore, will achieve the following effects.

During the manufacturing process of the semiconductor device 30, the alignment pattern that has been defined on the semiconductor layer 12 could be deformed into an asymmetric shape while the channel layer 16 is being formed by step flow growth as described above. Thus, the channel layer 16 and the gate insulating film 17, gate electrode 18, dielectric film 21, source electrode 19, upper interconnect electrode 1C, and passivation film (not shown) that partially covers the upper interconnect electrode 1G (all of which are supposed to be arranged on the channel layer 16 that has been formed) tend to shift more easily in one direction (e.g., in the Y direction in this example) with respect to the semiconductor layer 12. As a result, the gate electrode 18 could shift significantly in the Y direction with respect to the channel layer 16. As used herein, to "shift significantly" refers to a shift, of which the magnitude is far greater than the alignment accuracy of an exposure system. The semiconductor device of this preferred embodiment, however, is designed such that even if such a significant shift has occurred, the difference between the respective widths of the gate electrode 18 and the channel layer 16 (i.e., the margin) becomes greater in the Y direction rather than in the X direction. As a result, the deterioration in the device characteristics of the semiconductor device 30 can be minimized and its reliability can be increased instead.

Figure 13:
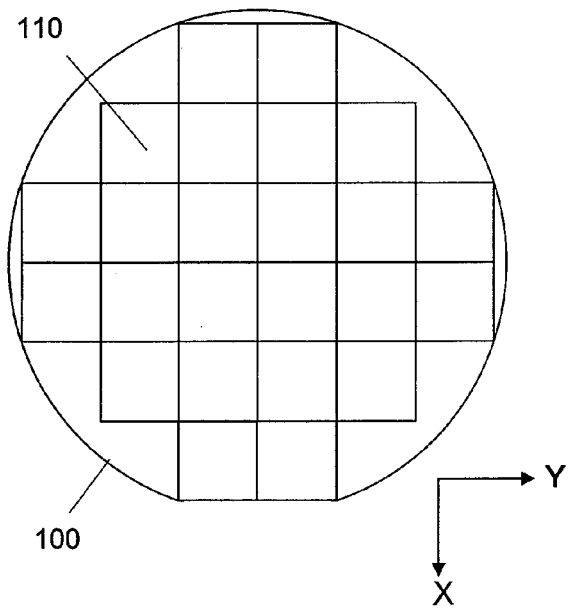
Figure 13:
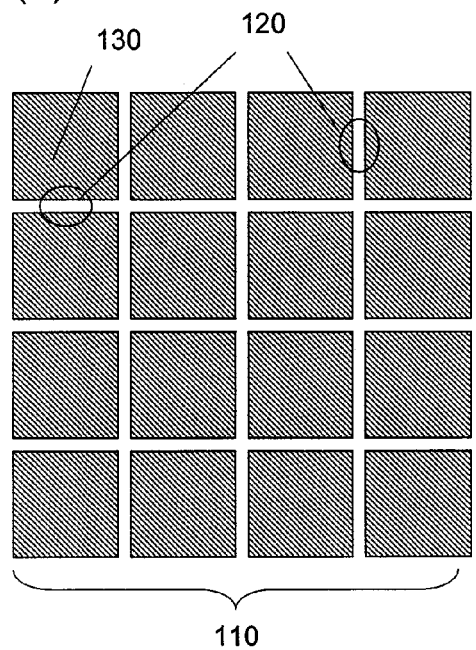
Figure 13:
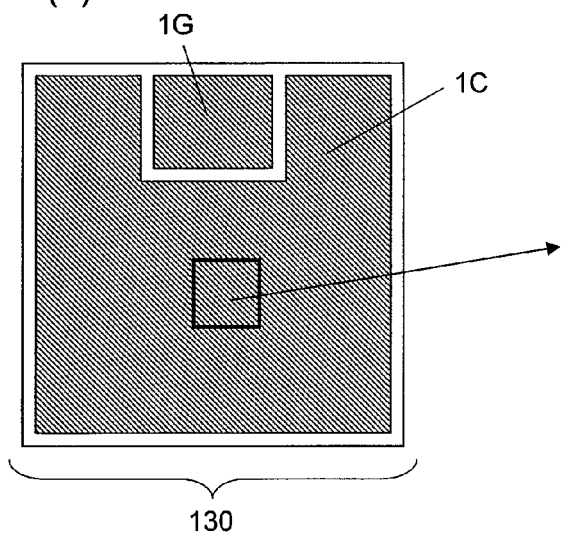
Figure 13:
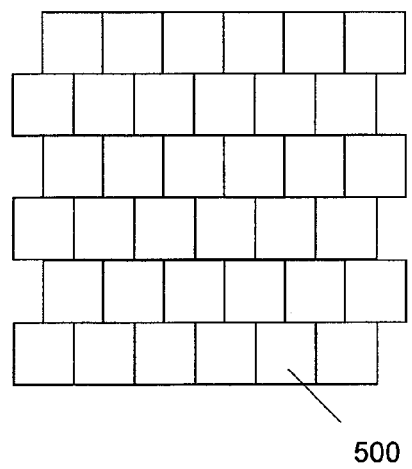
Figure 14:
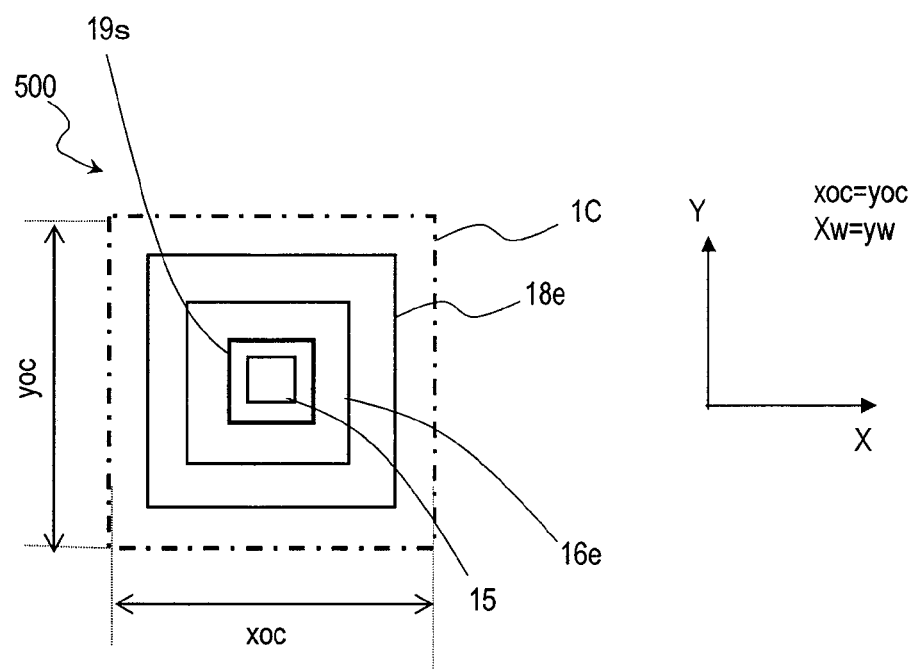
FIG. 14 is a schematic top view illustrating a conventional unit cell 500.
Figure 15:
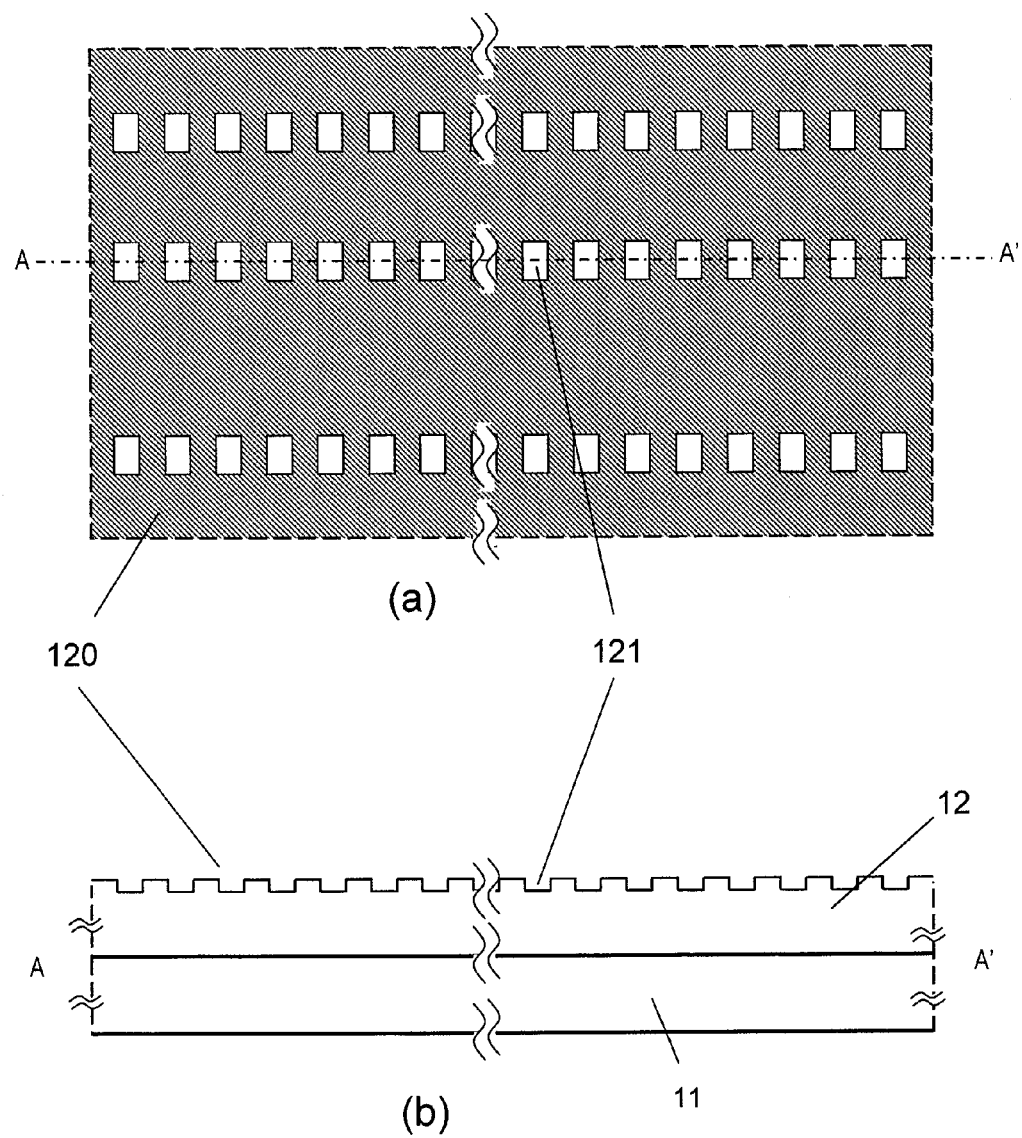
FIGS. 15(a) and 15(b) are respectively a plan view and a cross-sectional view schematically illustrating an alignment pattern.

Hereinafter, this semiconductor device 30 will be described in further detail in comparison with the conventional semiconductor device 130 that has already been described with reference to FIGS. 13 and 14.

In the unit cell 500 of the conventional semiconductor device 130, the respective openings 16e and 18e of the channel layer and gate electrode are both square in a plan view, and therefore, the difference between the respective widths of the gate electrode and the channel layer as measured in the X direction is the same as their difference as measured in the Y direction. In such a unit cell 500, if the planar shape of the alignment pattern changed, either the channel layer or the gate electrode could shift significantly in the Y direction. As a result, the device characteristics could deteriorate considerably, or in a worst-case scenario, the semiconductor device could no longer operate as a transistor anymore.

Figure 3:
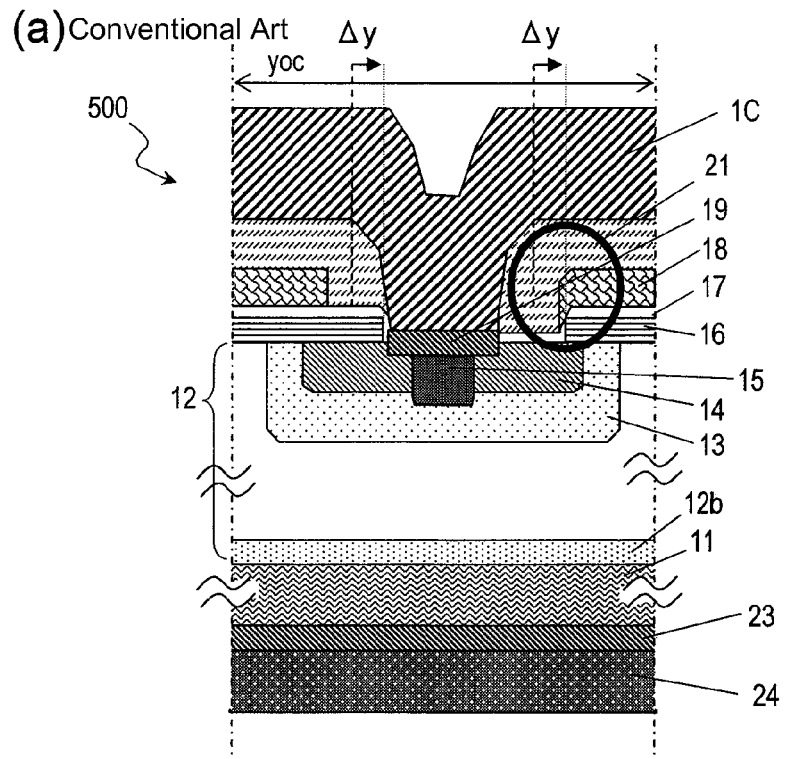
FIGS. 3(a) and 3(b) are schematic cross-sectional views illustrating a conventional unit cell and a unit cell according to the first preferred embodiment of the present invention, respectively, as viewed in the Y direction.
Figure 3:
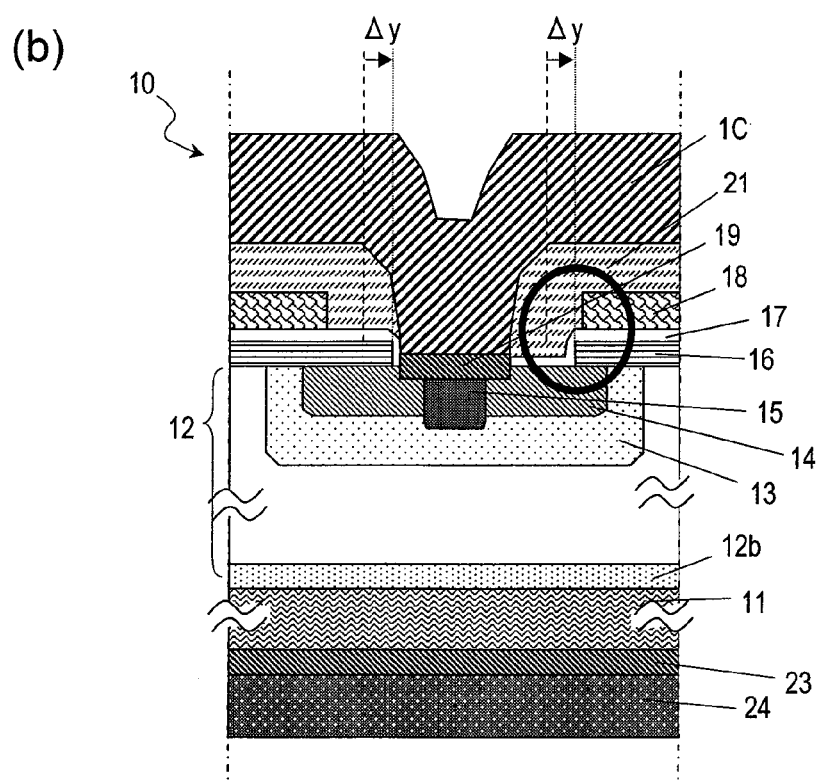

FIG. 3(a) is a schematic cross-sectional view illustrating the conventional unit cell 500 as viewed in the Y direction. In the structure shown in FIG. 3(a), only the channel layer has shifted significantly in the Y direction. In FIG. 3(a), any element also shown in FIGS. 1(a) to 1(c) is identified by the same reference numeral as its counterpart's and the description thereof will be omitted herein.

In the example illustrated in FIG. 3(a), the channel layer 16 has shifted in the Y direction and the magnitude of its shift Δy is greater than a half of the absolute value $m_y$ of the difference between the respective lengths of the channel layer 16 and the gate electrode 18 as measured in the Y direction (i.e., |xe−xg|/2=|ye−yg|/2<Δy). Meanwhile, the gate electrode 18 has been formed just as designed. Thus, the gate electrode 18 gets misaligned with the channel layer 16 and the end of the right hand side portion of the gate electrode 18 cannot be located on the channel layer 16 but goes beyond the channel layer 16. In that case, the end of the gate electrode 18 also reaches the side surface of its associated end of the channel layer 16, thus causing short-circuit between the gate electrode 18 and the channel layer 16 easily and deteriorating the device characteristics seriously.

On the other hand, in the unit cell 10 of this preferred embodiment, even if only the channel layer 16 has shifted in the Y direction by Δy (>|xe−xg|/2) but if Δy is smaller than a half of the absolute value $m_y$ of the difference between the respective lengths ye and yg of channel layer 16 and the gate electrode 18 as measured in the Y direction (i.e., if Δy<|ye−yg|/2=|xe−xg|/2+Δm/2), the end 18g of the gate electrode 18 will never go beyond the channel layer 16 but still stay on the channel layer 16 as shown in FIG. 3(b). As a result, it is possible to prevent the misalignment from causing short-circuit between the gate electrode 18 and the channel layer 16, and the reliability of the semiconductor device can be increased.

The same statement will apply to a situation where only the gate electrode 18 has shifted significantly in the Y direction due to a deformation of the planar shape of the alignment pattern.

Figure 4:
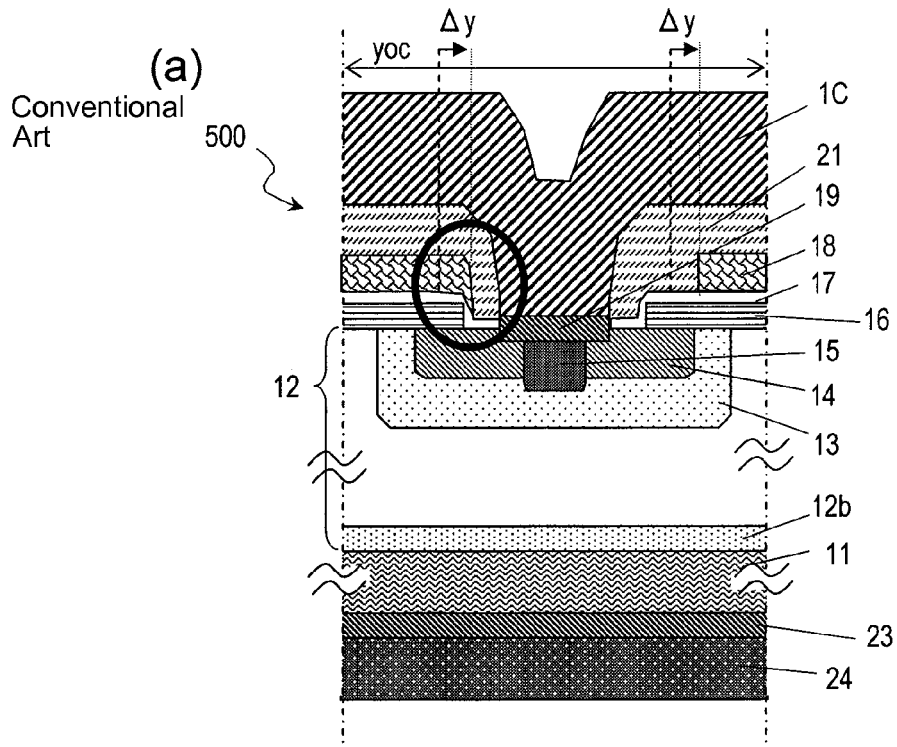
FIGS. 4(a) and 4(b) are schematic cross-sectional views illustrating another conventional unit cell and another unit cell according to the first preferred embodiment of the present invention, respectively, as viewed in the Y direction.
Figure 4:
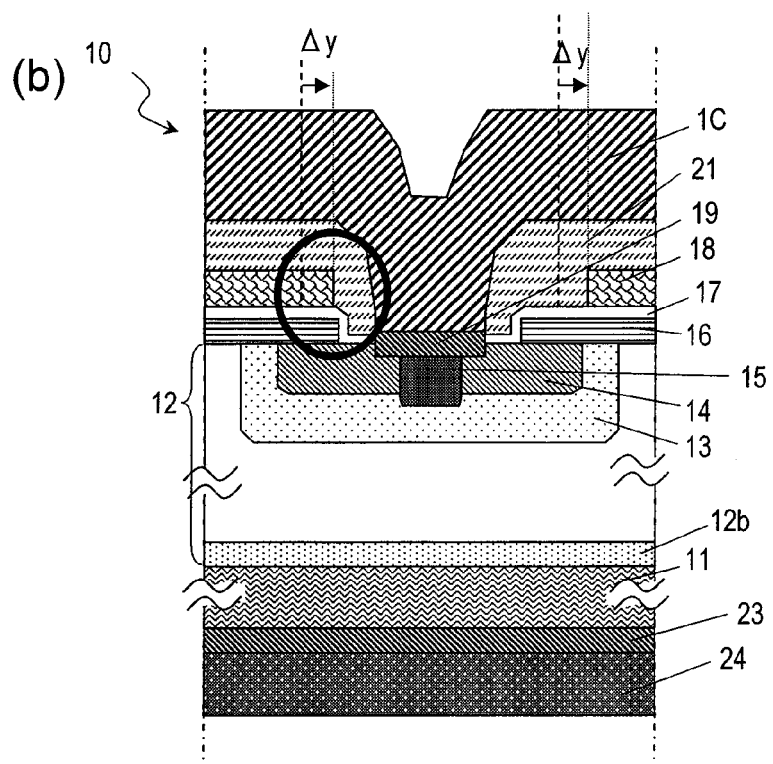

FIGS. 4(a) and 4(b) are schematic cross-sectional views illustrating the conventional unit cell 500 and the unit cell 10 of this preferred embodiment, respectively, as viewed in the Y direction. In the structures shown in FIGS. 4(a) and 4(b), only the gate electrode 18 has shifted significantly in the Y direction. In FIGS. 4(a) and 4(b), any element also shown in FIGS. 1(a) to 1(c) is identified by the same reference numeral as its counterpart's and the description thereof will be omitted herein.

In the example illustrated in FIG. 4(a), the gate electrode 18 has shifted in the Y direction and the magnitude of its shift Δy is greater than a half of the absolute value $m_y$ of the difference between the respective lengths of the channel layer 16 and the gate electrode 18 as measured in the Y direction (i.e., |xe−xg|/2=|ye−yg|/2<Δy). Meanwhile, the channel layer 16 has been formed just as designed. Thus, the gate electrode 18 gets misaligned with the channel layer 16 and one end of the gate electrode 18 cannot be located on the channel layer 16 but goes beyond the channel layer 16. In that case, that end of the gate electrode 18 also reaches the side surface of its associated end of the channel layer 16, thus causing short-circuit between the gate electrode 18 and the channel layer 16 easily and deteriorating the device characteristics seriously.

On the other hand, in the unit cell 10 of this preferred embodiment, even if only the gate electrode 18 has shifted in the Y direction by Δy (>|xe−xg|/2) but if Δy is smaller than a half of the absolute value $m_y$ of the difference between the respective lengths ye and yg of channel layer 16 and the gate electrode 18 as measured in the Y direction (i.e., if Δy<|ye−yg|/2=|xe−xg|/2+Δm/2), the end 18g of the gate electrode 18 will never go beyond the channel layer 16 but still stay on the channel layer 16 as shown in FIG. 4(b). As a result, it is possible to prevent the misalignment from causing short-circuit between the gate electrode 18 and the channel layer 16, and the reliability of the semiconductor device can be increased.

Δm (=|ye−yg|−|xe−xg|) is appropriately determined based on the maximum value $\Delta y_{max}$ of the magnitude Δy of shift that has been caused in the Y direction due to the deformation of the alignment pattern. Specifically, Δm is determined so as to satisfy the following equation:

$$\Delta y_{max} < |xe-xg|/2 + \Delta m/2$$

$\Delta y_{max}$ varies according to the thickness of the channel layer 16 and the off-axis angle (i.e., the tilt angle defined by the off-cut plane with respect to the basal crystal plane). For example, if the off-axis angle falls within the range of 4 to 8 degrees and if the thickness of the channel layer 16 is within the range of 14 nm to 140 nm, then $\Delta y_{max}$ is 0.2 μm to 1.0 μm, for example. In that case, Δm may be appropriately determined within the range of 0.2 μm to 1.8 μm.

Furthermore, in the semiconductor device 30 of this preferred embodiment, the margin to be left in the Y direction between the gate electrode 18 and the channel layer 16 is broader than their margin in the X direction. As for other elements, however, the same margin is supposed to be left in both of the X and Y directions between the channel layer 16 and the source electrode 19 and between the source electrode and the contact region (i.e., $s_x=s_y$, and $u_x=u_y$), for example.

If the semiconductor device is designed as described above so that only the margin to be left in the Y direction between the gate electrode 18 and the channel layer 16, where misalignment is particularly likely to occur due to the deformation of the alignment pattern, is selectively broadened with the same margin left between any other pair of elements in the X and Y directions, the increase in the size of the unit cell can be reduced significantly compared to a situation where a greater margin is left in the Y direction than in the X direction between every pair of elements. As described above, the smaller the size of the unit cell, the greater the channel width per unit area and the greater the effective channel width (that is the sum of the respective channel widths of all unit cells). As a result, a greater amount of ON-state current can flow through the semiconductor device with its ON-state resistance reduced.

Hereinafter, the size of the unit cell will be described more specifically. For the purpose of comparison, the size of a unit cell that has been designed so that the same margin is left in the X and Y directions between every pair of components (i.e., Δm=0) is supposed to be 10 μm square (which will be referred to herein as a "reference size"). In this preferred embodiment, if the margin to be left in the Y direction between the gate electrode 18 and the channel layer 16 is broadened by 0.5 μm (i.e., Δm=0.5 μm) with respect to the margin in the X direction, then the unit cell 10 has a size of 10 μm×10.5 μm, which is greater than the reference size. Nevertheless, there is a difference of just 5% between the area of the unit cell of the reference size and that of the unit cell of this preferred embodiment. Thus, that difference should not be great enough to decrease the effective channel width significantly. On the other hand, if a semiconductor device were designed so as to increase the margin in the Y direction (i.e., in the off-cut direction) between every pair of elements, then the size of the unit cell would be much greater than the reference size. For example, if the margin in the Y direction were broadened by 0.5 μm (i.e., Δm=0.5 μm) not only between the channel layer and the gate electrode but also between the contact region and the conductive surface and between the conductive surface and the channel layer as well, then the size of the unit cell would be 10 μm×11.5 μm. In that case, the difference between the area of such a unit cell and that of a unit cell of the reference size would be as much as 15%, which is large enough to decrease the effective channel width significantly.

Consequently, according to this preferred embodiment, the semiconductor device ensures a higher degree of reliability than a conventional one with a sufficient amount of ON-state current secured by minimizing the increase in the size of the unit cell.

In the example illustrated in FIG. 1, the semiconductor device is designed so as to satisfy $s_x=s_y$ and $u_x=u_y$. However, the semiconductor device of the present invention does not have to have such a configuration. Rather, the effect of the present invention can be achieved as long as the difference (i.e., $t_y-t_x>0$) between the margins to be left in the Y and X directions between the gate electrode 18 and the channel layer 16 is greater than the difference (i.e., $s_y-s_x$) between the margins to be left in the Y and X directions between the channel layer 16 and the source electrode 19, i.e., if the following Equations (1) and (2):

$$t_y - t_x > 0 \tag{1}$$

$$t_y - t_x > s_y - s_x \tag{2}$$

are satisfied. Consequently, as long as these Equations (1) and (2) are satisfied, it does not matter whether $s_x > s_y$ or $s_x < s_y$ is met. Likewise, it does not matter, either, whether $u_x > u_y$ or $u_x < u_y$ is met.

Furthermore, the following Equation (3):

$$t_y - t_x > u_y - u_x \tag{3}$$

is preferably satisfied because the increase in the size of the unit cell 10 can be reduced more effectively in that case.

To further reduce the size of the unit cell, $s_x = s_y$ and $u_x = u_y$ are preferably satisfied as shown in FIG. 1. Likewise, although not shown in FIG. 1, the same margin is preferably left in the X and Y directions between the respective widths of the unit cell 10 and the opening 18e of the gate electrode 18.

The margin $t_x$ to be left in the X direction between the gate electrode 18 and the channel layer 16 and other margins $s_x$, $s_y$, $u_x$ and $u_y$ are appropriately determined according to the patterning precision of the system for use to fabricate the semiconductor device. On the other hand, the margin $t_y$ to be left in the Y direction between the gate electrode 18 and the channel layer 16 becomes the sum of the margin $t_x$ to be left in the X direction and a length ($\Delta m$) that is great enough to compensate for the deformation of the alignment mark.

Although not shown, the end of the conductive surface 19s of the source electrode 19 could be in contact with the end of the opening of the channel layer 16 (i.e., $s_x = 0$ and $s_y = 0$). In that case, it is particularly preferred that not only Equations (1) and (2) but also Equation (3) be satisfied at the same time.

Figure 5:
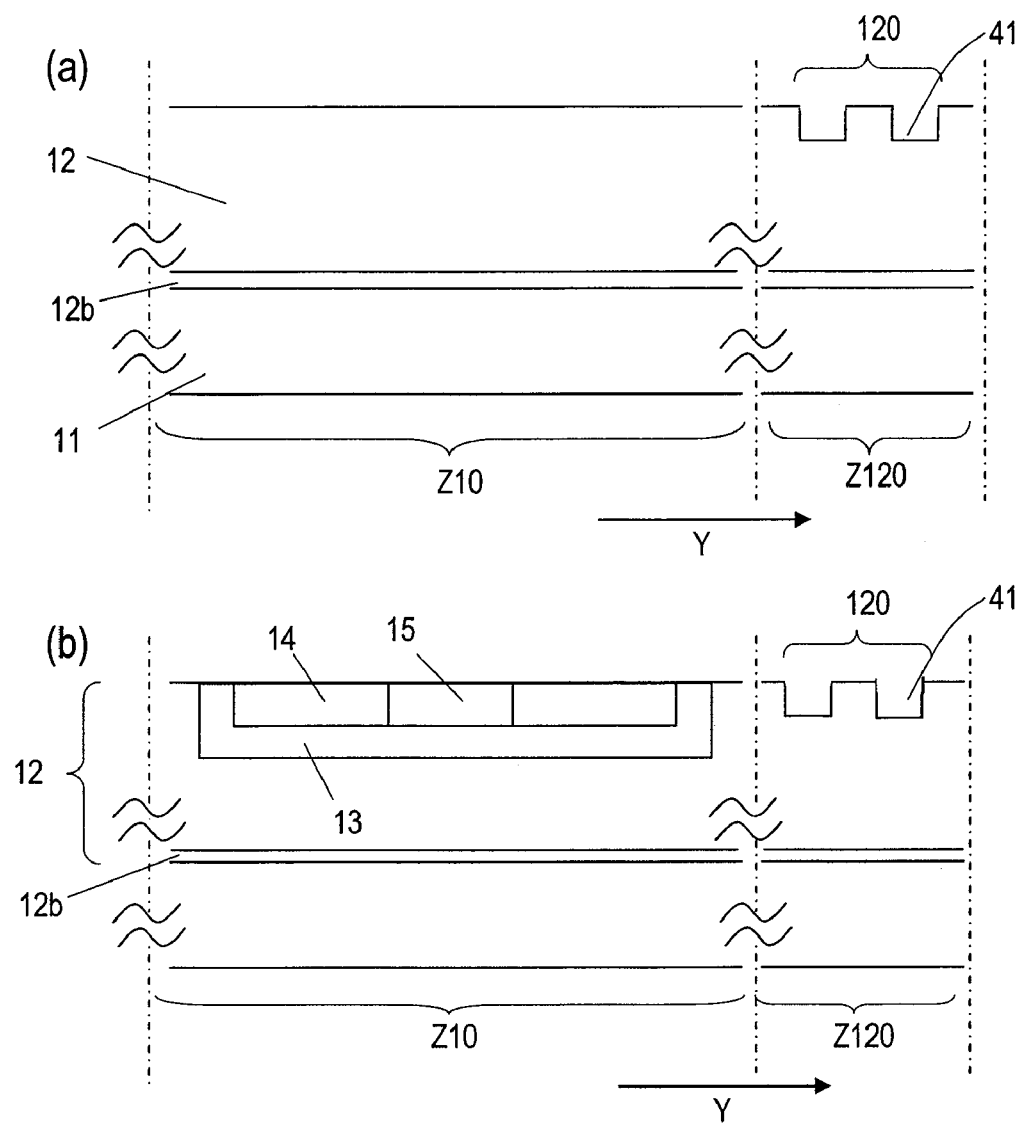
FIGS. 5(a) and 5(b) are schematic cross-sectional views illustrating respective process steps to fabricate the semiconductor device of the first preferred embodiment of the present invention.
Figure 6:
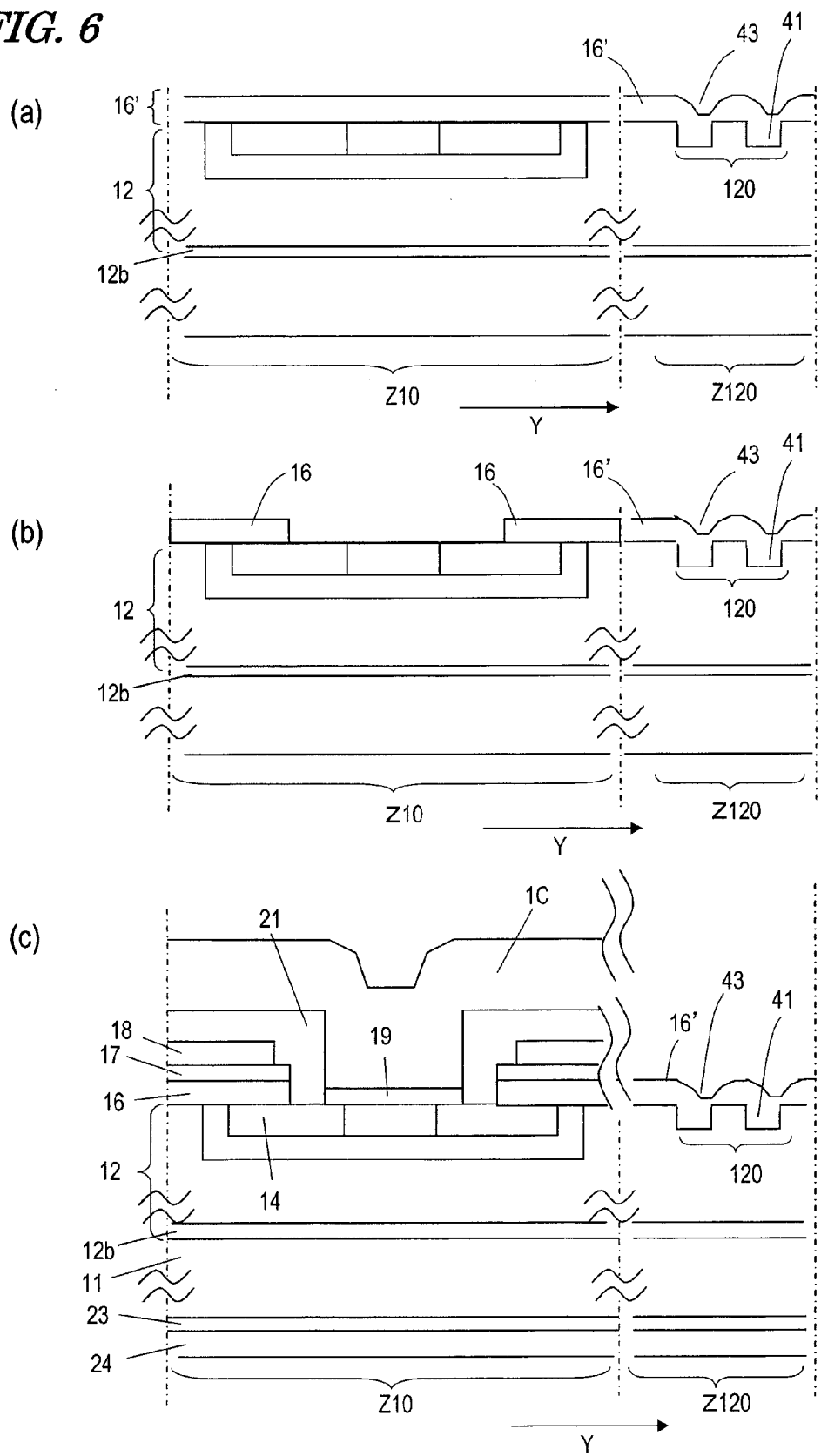
FIGS. 6(a) through 6(c) are schematic cross-sectional views illustrating respective process steps to fabricate the semiconductor device of the first preferred embodiment of the present invention.

Hereinafter, it will be described how to fabricate the semiconductor device 30 of this preferred embodiment. According to this preferred embodiment, semiconductor devices are fabricated on a shot region (110) basis on the semiconductor bulk substrate 100 shown in FIG. 2(a). FIGS. 5 and 6 are cross-sectional views illustrating respective process steps to fabricate the semiconductor devices 30 of this preferred embodiment. Each of these drawings illustrates an area Z10 in the shot region 110 in which one of the unit cells 10 of each semiconductor device 30 is going to be fabricated and an area Z120 in which an alignment pattern is going to be defined. The area Z10 is a so-called "device area". And the area Z120 is left between adjacent device areas in the shot region 110.

First of all, as shown in FIG. 5(a), a semiconductor layer 12 is formed on a semiconductor substrate 11 by growing silicon carbide epitaxially. Then, the surface of the semiconductor layer 12 is partially etched away to define a stepped alignment pattern 120, which has a number of recesses (markers) 41.

In this preferred embodiment, an n-type 4H—SiC (0001) wafer, of which the principal surface has been cut so as to define an off-axis angle of 8 degrees with respect to a <11-20> direction, is used as the semiconductor substrate 11. The wafer may have a dopant concentration of $1 \times 10^{19}$ cm$^{-3}$, for example. The semiconductor layer 12 may be a silicon carbide epitaxial layer made of 4H—SiC, for example.

The semiconductor layer 12 is obtained by growing epitaxially silicon carbide (4H—SiC) on the Si face (i.e., a (0001) plane) of the semiconductor substrate 11. The conductivity type of the semiconductor layer 12 is n-type. In this preferred embodiment, first, a buffer layer 12b including an n-type dopant in as high a concentration as $1 \times 10^{18}$ cm$^{-3}$, for example, is deposited to a thickness of 1 μm, and then an epitaxial layer to be a drift layer with as low a dopant concentration as $5 \times 10^{15}$ cm$^{-3}$ is deposited to a thickness of approximately 12 μm, thereby obtaining the semiconductor layer 12.

The markers 41 of the alignment pattern 120 can be left by partially removing the surface of the semiconductor layer 12 by dry etching process. As the etchant, a mixture of $CF_4$ and $O_2$ gases may be used, for example. The alignment pattern 120 may have a step (i.e., the depth of the markers 41) of approximately 0.3 μm, for example.

Next, as shown in FIG. 5(b), a p-well region 13, an n-type source region 14 and a p$^+$-type contact region 15 are defined in the semiconductor layer 12. Specifically, a masking layer of SiO$_2$ is formed on the semiconductor layer 12 and a p-type dopant (which may be Al) is introduced by ion implantation through the masking layer into a portion of the semiconductor layer 12 where the p-well region is going to be defined. In the same way, an n-type dopant (which may be nitrogen) and a p-type dopant (which may be Al) are introduced by ion implantation into other portions of the semiconductor layer 12 where the n-type source region and the p$^+$-type contact region are going to be defined. In performing these dopant ion implantation processes, the mask alignment is carried out using the markers 41. Thereafter, the dopants introduced are activated by performing an annealing process at a temperature of approximately 1,700° C., for example.

In this preferred embodiment, Al is supposed to be used as a p-type dopant for defining the p-well region 13 and the p$^+$-type contact region 15. However, B (boron) may be used instead. Also, although nitrogen is used as an n-type dopant for defining the n-type source region 14 in this preferred embodiment, P (phosphorus) may also be used. The p-well region 13, n-type source region 14 and p$^+$-type contact region 15 may have dopant concentrations of $2 \times 10^{18}$ cm$^{-3}$, $1 \times 10^{19}$ cm$^{-3}$ and $5 \times 10^{19}$ cm$^{-3}$, and thicknesses (or depths) of 0.4 μm, 0.2 μm and 0.25 μm, respectively. It should be noted that as the dopant concentrations and thicknesses of these regions 13, 14 and 15 are appropriately determined according to the desired device characteristic, the concentrations and thicknesses do not have to have these values.

Figure 16:
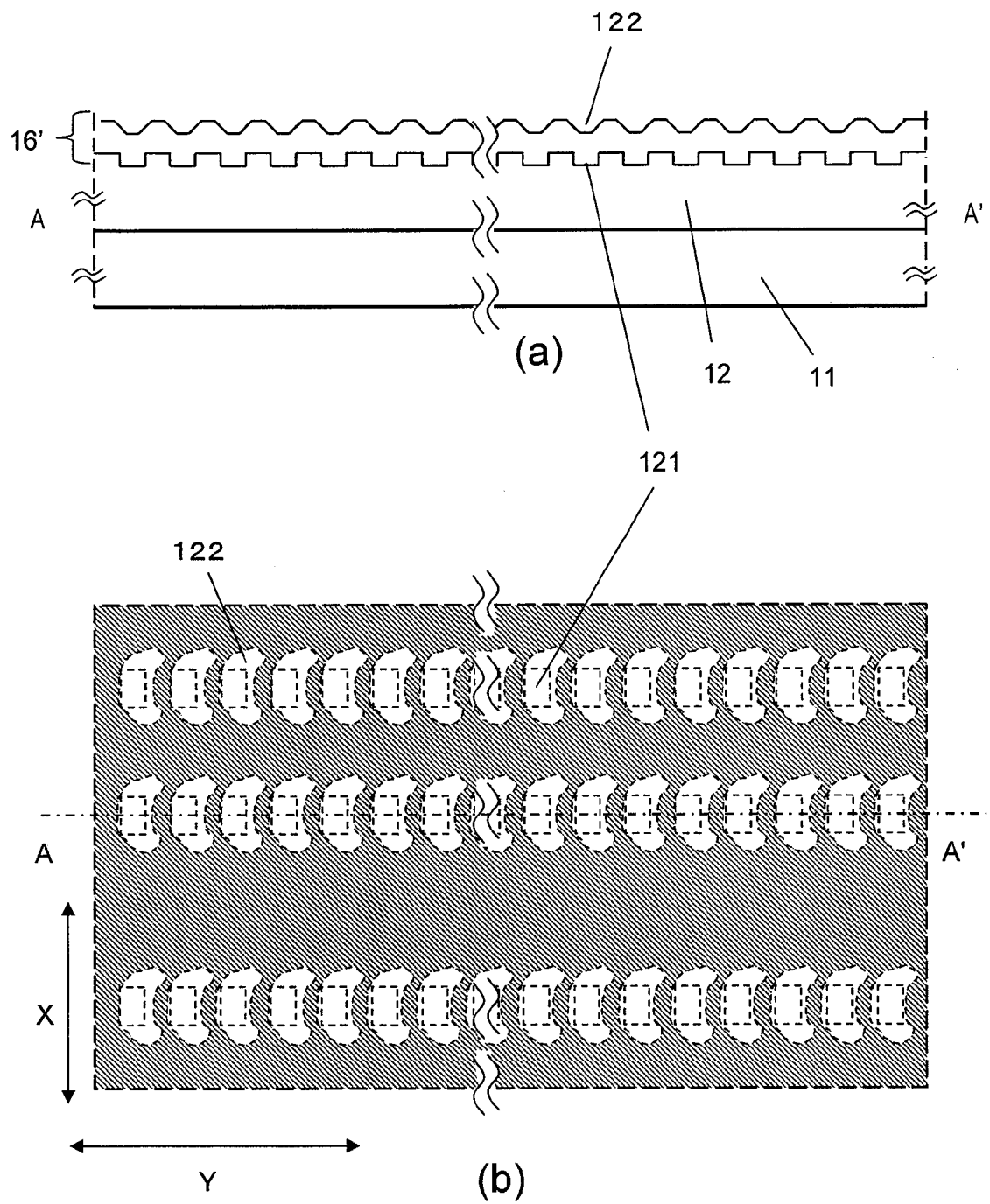
FIGS. 16(a) and 16(b) are respectively a cross-sectional view and a plan view schematically illustrating how the alignment pattern will be deformed after an extra epitaxial layer has been grown.

Thereafter, as shown in FIG. 6(a), another semiconductor layer (to be an extra epi-layer) 16' is grown epitaxially on the semiconductor layer 12. In this preferred embodiment, a 4H—SiC layer with an average dopant concentration of approximately $1 \times 10^{17}$ cm$^{-3}$ and a thickness of approximately 0.1 μm is formed as the semiconductor layer 16'. It should be noted that as the dopant concentration and thickness of the semiconductor layer 16' are determined appropriately according to the transistor performance required, the semiconductor layer 16' does not have to have this concentration or thickness. Optionally, the semiconductor layer 16' may have a multilayer structure consisting of a heavily doped layer and a lightly doped layer (or an undoped layer). In that case, recesses 43 maintaining the shape of the markers 41 of the alignment pattern 120 are formed in a portion of the semiconductor layer 16' that is located over the alignment pattern 120. The planar shape of those recesses 43 becomes asymmetric as already described with reference to FIG. 16.

Next, as shown in FIG. 6(b), the semiconductor layer 16' is selectively etched to form a channel layer 16 in the area Z10. As for the area Z120, the semiconductor layer 16' and the recesses 43 may be either left as they are or removed by dry etching. If a dry etching process is carried out, conditions are set so as to make the vertical etch rate much higher than the horizontal one with respect to the substrate. At this point in time, markers, reflecting the surface shape of the recesses 43 on the surface of the semiconductor layer 16' in the area Z120, are formed. When the semiconductor layer 16' is etched away, a mask should be prepared by photolithographic process. If the recesses 43 were used as markers to get mask alignment done, then the mask could be formed at a location that has shifted significantly from the designed location in the Y direction. In that case, the channel layer 16 would be considerably misaligned with the semiconductor layer 12. Although not shown, in this etching process step, an additional alignment pattern (as a second alignment pattern) may be provided in a different area of the semiconductor layer 16' other than the areas Z10 and Z120.

After that, a vertical MOSFET unit cell 10 such as the one shown in FIG. 6(c) is obtained by forming a gate insulating film 17, a gate electrode 18, a source electrode 19, a dielectric film 21 and a drain electrode 23 by performing known process steps. Specifically, the following process steps are performed.

In this preferred embodiment, the gate insulating film 17 is formed on the upper surface of the channel layer 16 by thermally oxidizing the channel layer 16. Naturally, the gate insulating film 17 will also reach the side surface of the channel layer 16 and the inside of the opening that has been cut through the channel layer 16 by dry etching process. Alternatively, the gate insulating film 17 may also be formed by depositing an insulating film on the channel layer 16. In that case, the gate insulating film 17 will cover the upper and side surfaces of the channel layer 16 as shown in FIGS. 1(b) and 1(c).

Meanwhile, the gate electrode 18 is formed by depositing a conductor film of polysilicon or a metallic material on the gate insulating film 17 and then patterning the conductor film. Mask alignment also needs to be done during this pattern process step to make the gate electrode 18. The mask alignment can be done by using either the recesses 43 or the second alignment pattern that was defined during the patterning process step to form the channel layer 16.

Thereafter, a dielectric film 21 is deposited over the gate electrode 18, and then an opening is cut through the dielectric film 21 by patterning. During the patterning process step on the dielectric film 21, the mask alignment may also be done by using either the recesses 43 or the second alignment pattern. Optionally, another alignment pattern may be defined (as a third alignment pattern) while the gate electrode 18 is being patterned and then used to pattern the dielectric film 21 as well.

Subsequently, the source electrode 19 is formed at the bottom of the opening of the dielectric film 21. The source electrode 19 may be formed by depositing and patterning a metal film of Ni or Ti, for example, and then subjecting it to a heat treatment at a temperature of around 1,000° C. Alternatively, the source electrode 19 may also be formed by salicidation process, for example. After the source electrode 19 has been formed, an Al film is deposited to a thickness of approximately 3 μm in contact with the source electrode 19 and then etched into a required pattern, thereby obtaining the upper interconnect electrode 1C.

Meanwhile, a drain electrode 23 and a lower interconnect electrode 24 need to be formed on the other side of the semiconductor substrate 11. The drain electrode 23 may be formed by depositing a Ti or Ni film to a thickness of approximately 200 nm and then subjecting it to a heat treatment at a temperature of around 1,000° C. The lower interconnect electrode 24 may be formed by depositing a Ti film, a Ni film and an Ag film in this order to thicknesses of 0.3 μm, 1.0 μm and 1.0 μm, respectively.

Although not shown, a passivation film may be formed to surround the semiconductor device 30 by depositing SiN to a thickness of approximately 1 μm on the upper interconnect electrode 1C and then patterning it. If necessary, a protective coating of polyimide, for example, may be further stacked on the passivation film. In this manner, a vertical MOSFET with a unit cell 10 is completed.

In this preferred embodiment, the respective elements may have the following lengths as measured in the X and Y directions (in this example, $\Delta m = 0.5$ μm):

$xc = 10.0$ μm
$xj = 3.0$ μm
$xp = 7.0$ μm
$xn = 6.0$ μm
$xpp = 2.0$ μm
$xe = 3.05$ μm
$xg = 2.6$ μm
$xw = 3.0$ μm
$yc = 10.5$ μm
$yp = 7.5$ μm
$yj = 3.0$ μm
$yn = 6.5$ μm
$ypp = 2.0$ μm
$ye = 3.55$ μm
$yg = 2.6$ μm
$yw = 3.0$ μm However, the respective elements of this preferred embodiment do not have to have these sizes but could have any other appropriate sizes. The semiconductor device 30 does not always have to be fabricated by the process described above, either.

Embodiment 2

Hereinafter, a second specific preferred embodiment of a semiconductor device according to the present invention will be described with reference to the accompanying drawings.

FIGS. 7(a) through 7(c) are schematic representations illustrating a semiconductor device as a second preferred embodiment of the present invention. Specifically, FIG. 7(a) is a plan view illustrating a unit cell of the semiconductor device of this preferred embodiment, FIG. 7(b) is a cross-sectional view of the unit cell as viewed on the plane VIIb-VIIb', and FIG. 7(c) is a cross-sectional view of the unit cell as viewed on the plane VIIc-VIIc'. The relation between the unit cell and the semiconductor bulk substrate of this preferred embodiment is just as what has already been described with reference to FIG. 2. It should be noted that the planes VIIb-VIIb' and VIIc-VIIc' are parallel to the X and Y directions, respectively, in the semiconductor bulk substrate 100 shown in FIG. 2(a).

The unit cell 20 of this preferred embodiment has the same configuration as the unit cell 10 shown in FIGS. 1(a) to 1(c) except that the conductive surface 19s of the source electrode 19 has a greater length yw in the Y direction than its length xw in the X direction (i.e., xw<yw) but that the channel layer 16 has the same length in both of the X and Y directions (i.e., xe=ye). Any component having the same function as its counterpart shown in FIGS. 1(a) through 1(c) is identified by the same reference numeral for the sake of simplicity, and the description thereof will be omitted herein.

The unit cell 20 of this preferred embodiment is designed so that the lengths of its respective elements as measured in the X and Y directions satisfy the following equations (where $\Delta m > 0$):

$$yc = xc + \Delta m$$

$$yp = xp + \Delta m$$

$$yj = xj$$

$$yn = xn + \Delta m$$

$$ypp = xpp$$

$$ye = xe$$

$$yg = xg$$

$$yw = xw + \Delta m$$

Also, as described above, the absolute value $u_x$ of the difference between the respective lengths xw and xpp of the conductive surface 19s and the contact region 15 as measured in the X direction and the absolute value $u_y$ of the difference between the respective lengths yw and ypp of the conductive surface 19s and the contact region 15 as measured in the Y direction satisfy:

$$u_y = u_x + \Delta m > u_x$$

Thus, the unit cell 20 of this preferred embodiment has a greater margin $u_y$ between the conductive surface 19s of the source electrode 19 and the contact region 15 in the Y direction than in the X direction ($u_x$).

In this preferred embodiment, the markers that have been left on the semiconductor layer 12 could also be deformed into an asymmetric shape while a semiconductor layer to be a channel layer 16 is being formed by epitaxial growth. Thus, the channel layer 16 and the gate insulating film 17, gate electrode 18, source electrode 19, dielectric film 21, upper interconnect electrode 1C, and passivation film (not shown) that partially covers the upper interconnect electrode (all of which are supposed to be arranged on the channel layer 16 that has been formed) tend to shift more easily in the Y direction with respect to the doped regions 13, 14 and 15 in the semiconductor layer 12. The semiconductor device of this preferred embodiment, however, is designed such that even if such a significant shift has occurred, a greater margin is still left between the conductive surface 19s of the source electrode 19 and the contact region 15 in the Y direction than in the X direction. As a result, the source electrode 19 can be brought into contact with the source region 14 of the semiconductor layer 12 more closely, and an increase in its ON-state resistance, which would otherwise be caused due to their insufficient contact, can be reduced significantly, thus increasing the reliability.

Hereinafter, the effect to be achieved by this preferred embodiment will be described in further detail in comparison with a conventional semiconductor device.

Figure 8:
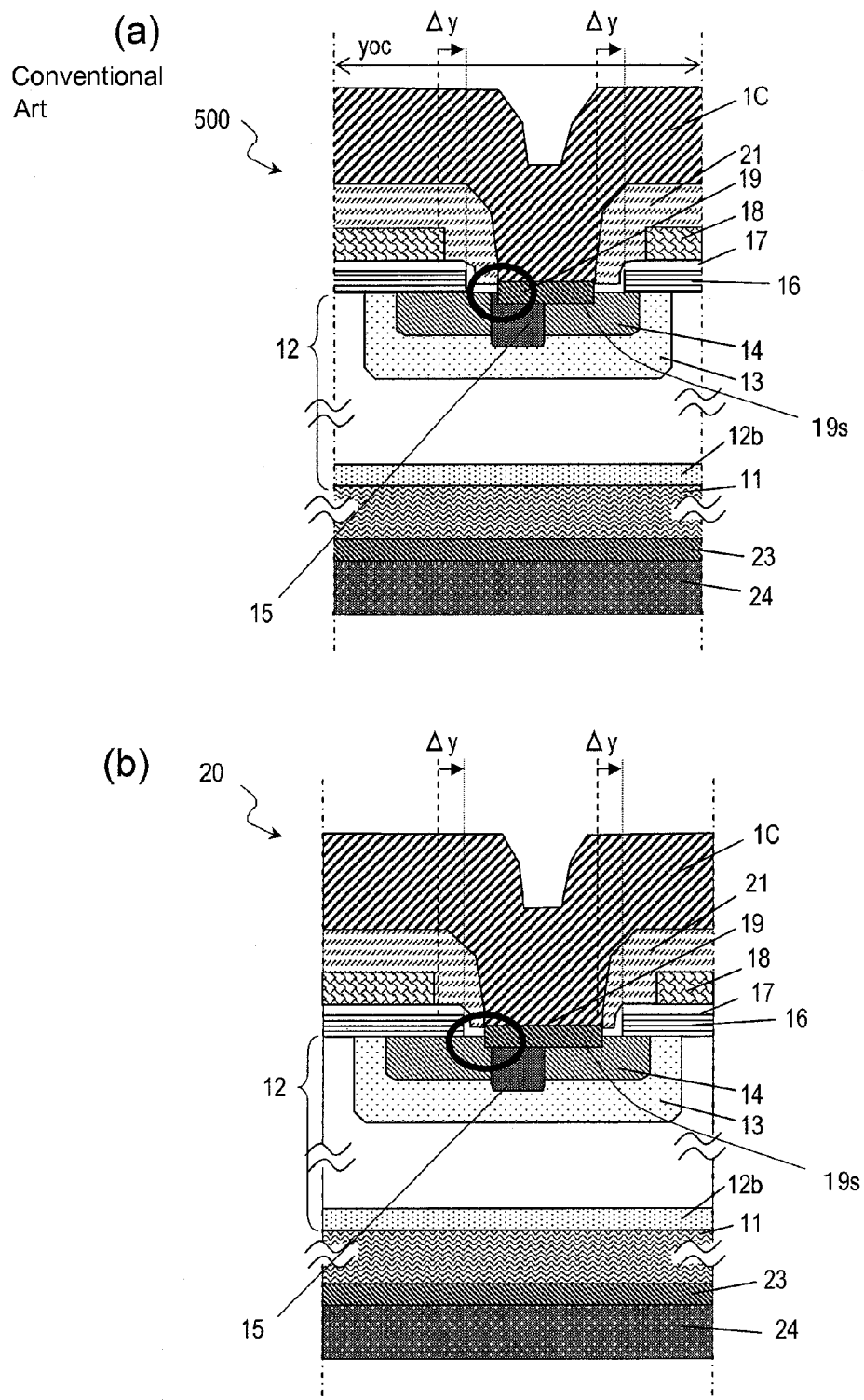
FIGS. 8(a) and 8(b) are schematic cross-sectional views illustrating a conventional unit cell and a unit cell according to the second preferred embodiment of the present invention, respectively, as viewed in the Y direction.

FIG. 8(a) is a schematic cross-sectional view illustrating the conventional unit cell 500 (that has already been described with reference to FIGS. 13 and 14) as viewed in the Y direction. In the structure shown in FIG. 8(a), every structure that has been arranged on the semiconductor layer 12, including the channel layer 16, the gate insulating film 17, the gate electrode 18, the source electrode 19, the dielectric film 21 and the upper interconnect electrode 1C, has shifted significantly in the Y direction die to the deformation of the planar shape of the alignment pattern. In FIG. 8(a), any element also shown in FIGS. 1(a) to 1(c) is identified by the same reference numeral as its counterpart's and the description thereof will be omitted herein.

In the example illustrated in FIG. 8(a), every structure on the semiconductor layer 12 has shifted by Δy in the Y direction and the magnitude of the shift Δy is greater than a half of the absolute value of the difference between the respective lengths of the conductive surface 19s of the source electrode 19 and the contact region 15 as measured in the Y direction (i.e., |xw−xpp|/2=|yw−ypp|/2<Δy). Thus, the source electrode 19 gets misaligned with the source region 14 in the semiconductor layer 12 and one end of the source electrode 19 is no longer connected to the source region 14. As a result, current can no longer flow smoothly through the left-hand-side portion of the source region 14, thus causing an increase in the ON-state resistance of the semiconductor device 130.

On the other hand, in the unit cell 20 of this preferred embodiment, even if the source electrode 19 has shifted in the Y direction by Δy (>|xw−xpp|/2) with respect to the source region 14 in the semiconductor layer 12 but if Δy is smaller than a half of the absolute value of the difference between the respective lengths of the conductive surface 19s of the source electrode 19 and the contact region 15 as measured in the Y direction (i.e., if Δy<|yw−ypp|/2=|xw−xpp|/2+Δm/2), the entire periphery of the source electrode 19 is still connected to the source region 14 as shown in FIG. 8(b). As a result, it is possible to prevent the misalignment from increasing the contact resistance between the source electrode 19 and the source region 14.

Furthermore, in this preferred embodiment, the margin to be left in the Y direction between the conductive surface 19s of the source electrode 19 and the contact region 15 is broader than their margin in the X direction. As for other elements, however, the same margin is supposed to be left in both of the X and Y directions between the channel layer 16 and the source electrode 19 (i.e., $s_x = s_y$), for example. Also, supposing $v_x$ represents the absolute value of the difference between the length (=xc−xg) of the opening 18e of the gate electrode 18 and the length xw of the conductive surface 19s of the source electrode 19 as measured in the X direction and $v_y$ represents the absolute value of the difference between the length (=yc−yg) of the opening 18e of the gate electrode 18 and the length yw of the conductive surface 19s of the source electrode 19 as measured in the Y direction, $v_x = v_y$ is satisfied.

As described above, the semiconductor device of this preferred embodiment is designed so that only the margin to be left in the Y direction between the source electrode 19 and the contact region 15, where misalignment is particularly likely to occur due to the deformation of the alignment pattern, is selectively broadened with the same margin left between any other pair of elements in the X and Y directions. Thus, the increase in the size of the unit cell can be reduced significantly compared to a situation where a greater margin is left in the Y direction than in the X direction between every pair of elements. As a result, a greater amount of ON-state current can flow through the semiconductor device with the decrease in its effective channel width minimized, thus providing a semiconductor device with a higher degree of reliability than conventional ones.

Figure 7:
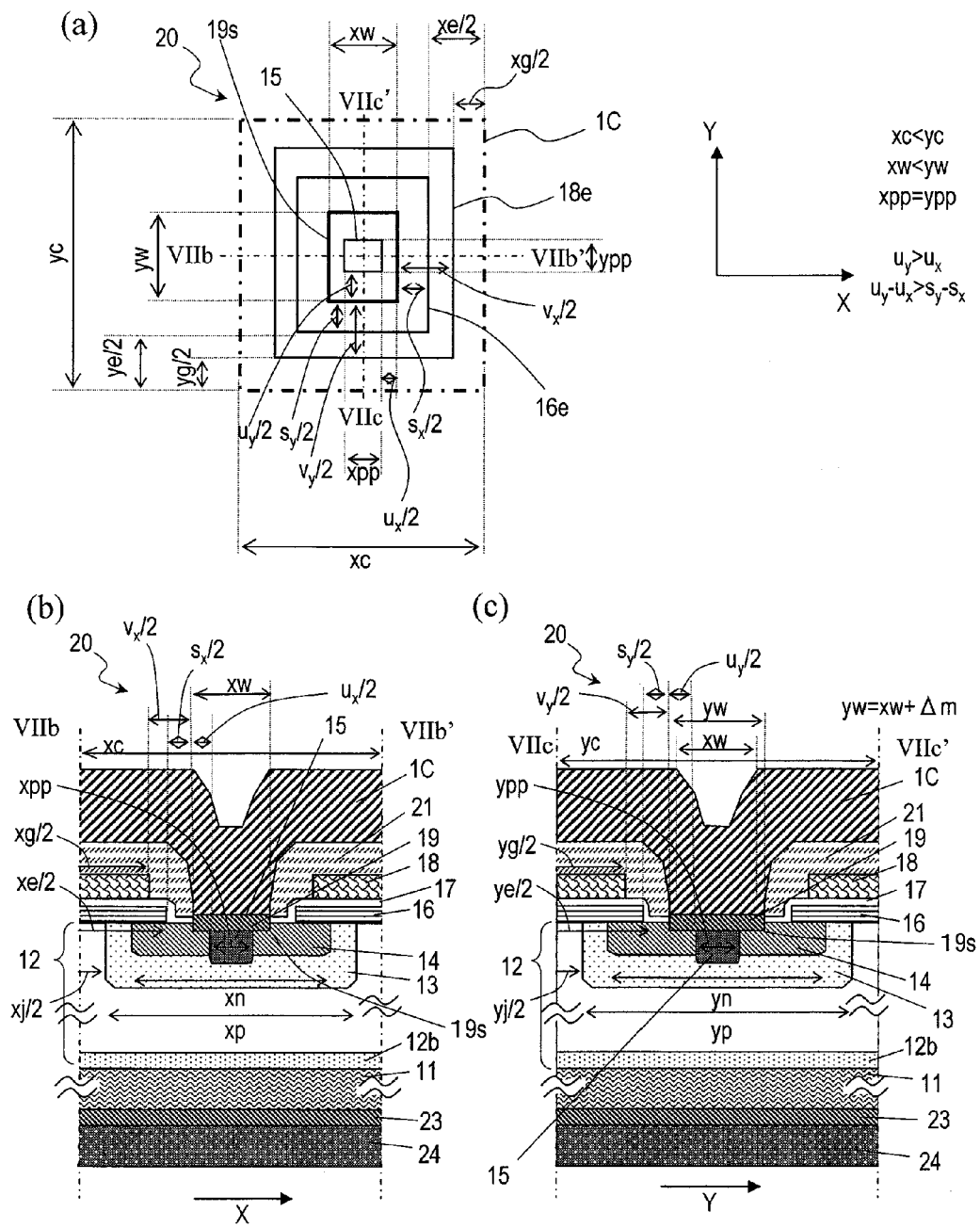

In the example illustrated in FIG. 7, the semiconductor device is designed so as to satisfy $s_x = s_y$ and $v_x = v_y$. However, the semiconductor device of the present invention does not have to have such a configuration. Rather, the effect of the present invention can also be achieved if the following Equations (4) and (5):

$$u_y - u_x > 0 \qquad (4)$$

$$u_y - u_x > s_y - s_x \qquad (5)$$

are satisfied. Consequently, as long as these Equations (4) and (5) are satisfied, it does not matter whether $s_x > s_y$ or $s_x < s_y$ is met. Likewise, it does not matter, either, whether $v_x > v_y$ or $v_x < v_y$ is met.

Furthermore, the following Equation (6):

$$u_y - u_x > v_y - v_x \qquad (6)$$

is preferably satisfied because the increase in the size of the unit cell 10 can be reduced more effectively in that case.

To further reduce the size of the unit cell, $s_x=s_y$ and $v_x=v_y$ are preferably satisfied as shown in FIG. 7. Likewise, although not shown in FIG. 7, the same margin is preferably left in the X and Y directions between the respective widths of the unit cell 10 and the opening 18e of the gate electrode 18.

Optionally, the end of the conductive surface 19s of the source electrode 19 could be in contact with the end of the opening of the channel layer 16 (i.e., $s_x=0$ and $s_y=0$). In that case, it is particularly preferred that not only Equations (4) and (5) but also Equation (6) be satisfied at the same time.

As in the first preferred embodiment described above, $\Delta m$ (=|yw−ypp|−|xw−xpp|) is appropriately determined according to this preferred embodiment based on the maximum value $\Delta y_{max}$ of the magnitude $\Delta y$ of shift that has been caused in the Y direction due to the deformation of the alignment pattern. Specifically, $\Delta m$ is determined so as to satisfy the following equation:

$$\Delta y_{max} < |xw-xpp|/2 + \Delta m/2$$

$\Delta y_{max}$ varies according to the off-axis angle of the semiconductor substrate. For example, if the off-axis angle falls within the range of 4 to 8 degrees and if the thickness of the channel layer 16 is within the range of 14 nm to 140 nm, then $\Delta y_{max}$ is 0.2 μm to 1.0 μm, for example. In that case, $\Delta m$ may be appropriately determined within the range of 0.2 μm to 1.8 μm, for instance.

In this preferred embodiment, the respective elements may have the following lengths as measured in the X and Y directions (in this example, $\Delta m=0.5$ μm):

xc=10.0 μm
xj=3.0 μm
xp=7.0 μm
xn=6.0 μm
xpp=2.0 μm
xe=3.05 μm
xg=2.6 μm
xw=3.0 μm
yc=10.5 μm
yp=7.5 μm
yj=3.0 μm
yn=6.5 μm
ypp=2.0 μm
ye=3.05 μm
yg=2.6 μm
yw=3.5 μm The unit cell of this preferred embodiment does not have to have the configuration of the unit cell 20 shown in FIG. 7. In the unit cell 20, the length yw of the conductive surface 19s of the source electrode 19 as measured in the Y direction is greater its length xw as measured in the X direction (i.e., yw>xw). Alternatively, the unit cell may also be designed so that these lengths are equal to each other but that the length ypp of the p$^+$-type contact region 15 as measured in the Y direction is greater than its length xpp as measured in the X direction. Even so, the effect described above will also be achieved. Hereinafter, the configuration of such a semiconductor device will be described.

Figure 9:
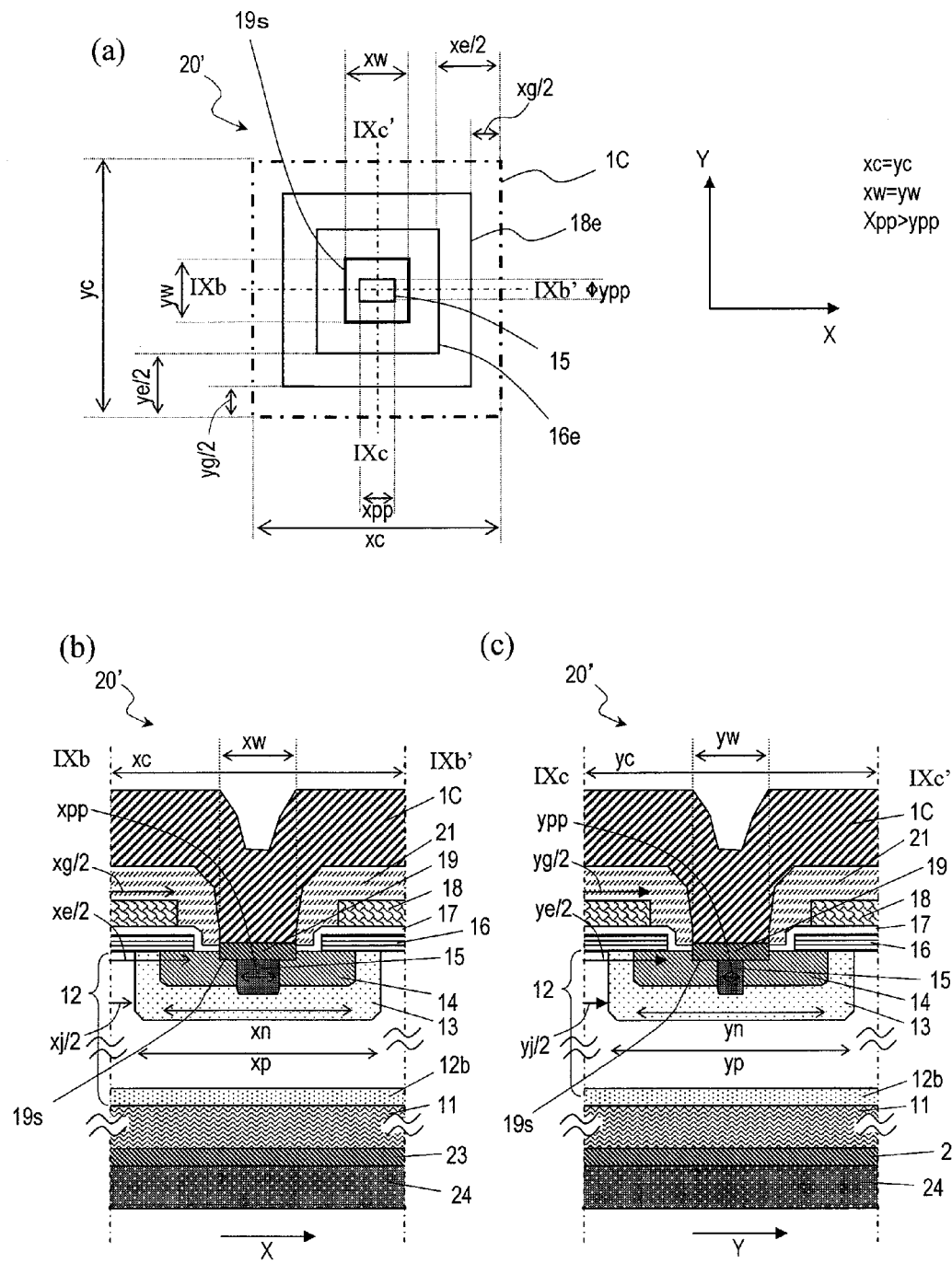

FIGS. 9(a) through 9(c) are schematic representations illustrating another semiconductor device as a modified example of the second preferred embodiment of the present invention. Specifically, FIG. 9(a) is a plan view illustrating a unit cell of the semiconductor device of this preferred embodiment, FIG. 9(b) is a cross-sectional view of the unit cell as viewed on the plane IXb-IXb', and FIG. 9(c) is a cross-sectional view of the unit cell as viewed on the plane IXc-IXc'. It should be noted that the planes IXb-IXb' and IXc-IXc' are parallel to the X and Y directions, respectively, in the semiconductor bulk substrate 100 shown in FIG. 2(a).

The semiconductor device 20' is designed so that the lengths of its respective elements as measured in the X and Y directions satisfy the following equations (where $\Delta m>0$):

yc=xc yp=xp yj=xj yn=xn ypp=xpp−Δm ye=xe yg=xg yw=xw

Consequently, as in the unit cell 20 shown in FIG. 7, $$u_y = u_x + \Delta m > u_x$$

is satisfied.

In this unit cell 20', even if the misalignment $\Delta y$ in the Y direction is greater than |xw−xpp|/2 but if $\Delta m$ is determined so as to satisfy $\Delta y<|xw-xpp|/2+\Delta m/2$, the entire periphery of the source electrode 19 can be connected to the source region 14 more securely. As a result, the decrease in ON-state resistance can be smaller than in a conventional vertical MOSFET.

A contact region that has an elliptical planar shape is described as an example in a pamphlet of PCT International Application Publication No. 2007/135940, which was filed by the applicant of the present application. However, that document discloses nothing about where that ellipse should be arranged in the off-cut direction on an off-cut semiconductor substrate (i.e., the arrangement of the major or minor axis of the ellipse with respect to the off-cut direction). Thus, unlike the preferred embodiment of the present invention described above, that contact region would not contribute to reducing the increase in ON-state resistance due to a misalignment that has occurred in the off-cut direction.

The semiconductor device of this preferred embodiment can be fabricated by the same process as what has already been described with reference to FIGS. 5 and 6.

Figure 10:
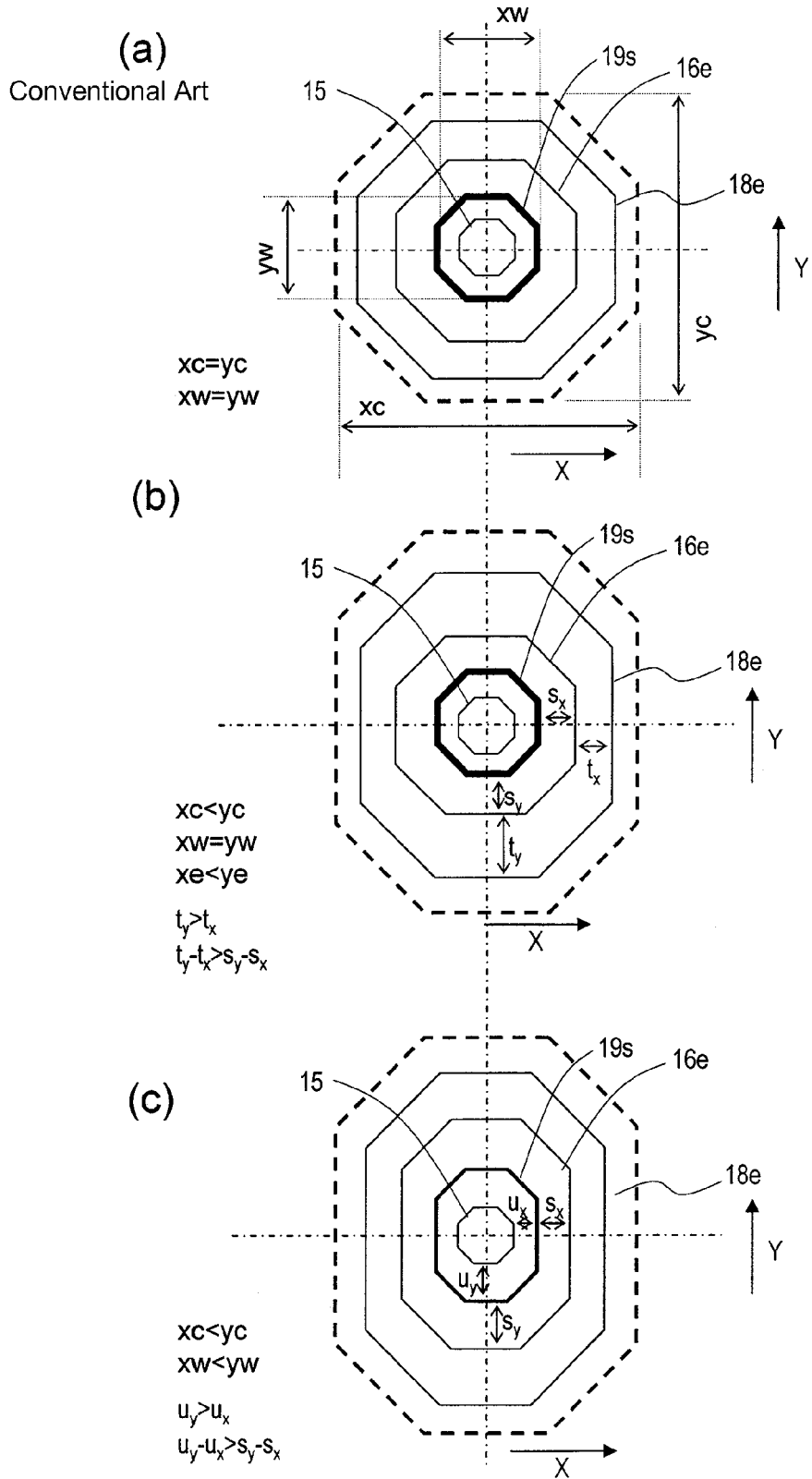
FIGS. 10(a), 10(b) and 10(c) are schematic plan views illustrating a conventional octagonal unit cell and octagonal unit cells, of which the structures correspond to those of the first and second preferred embodiments of the present invention, respectively.
Figure 11:
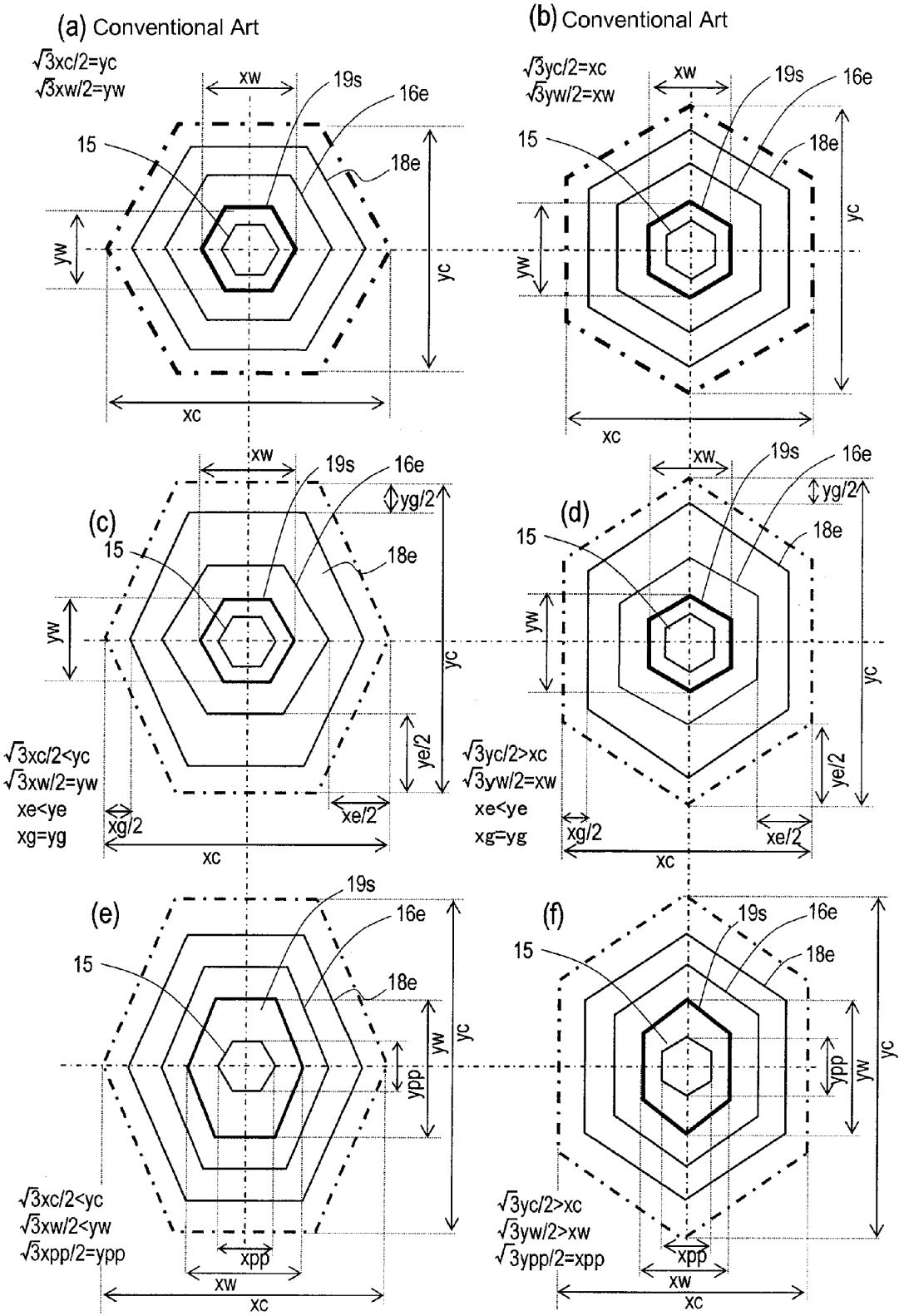
FIGS. 11(a) and 11(b) are schematic plan views illustrating conventional hexagonal unit cells.
FIGS. 11(c) and 11(d) are schematic plan views illustrating hexagonal unit cells, of which the structures correspond to that of the first preferred embodiment of the present invention.
FIGS. 11(e) and 11(f) are schematic plan views illustrating hexagonal unit cells, of which the structures correspond to that of the second preferred embodiment of the present invention.

In the first and second preferred embodiments of the present invention described above, each of the unit cells 10, 20 and 20' is supposed to have a square planar shape. However, the unit cell may also have an octagonal, hexagonal or any other appropriate polygonal planar shape. In that case, the respective unit cells may be arranged on the semiconductor substrate so that one of the two center lines, which both pass through the centroid of the unit cell and which cross each other at right angles, defines the X direction and the other center line defines the Y direction as shown in FIGS. 10 and 11.

FIGS. 10(a) through 10(c) are schematic plan views illustrating unit cells with octagonal planar shapes. Specifically, FIG. 10(a) illustrates a conventional unit cell that has been designed to have an isotropic structure both in the X and Y directions, while FIGS. 10(b) and 10(c) illustrate unit cells, of which the structures respectively correspond to the first and second preferred embodiments of the present invention described above. For the sake of simplicity, any component having the same function as its counterpart shown in FIG.

1(a) or 7(a) is identified by the same reference numeral as its counterpart's and the description thereof will be omitted herein.

FIGS. 11(a) through 11(f) are schematic plan views illustrating unit cells with hexagonal planar shapes. Specifically, FIGS. 11(a) and 11(b) illustrate conventional unit cells that have been designed to have an isotropic structure both in the X and Y directions. FIGS. 11(c) and 11(d) illustrate unit cells, of which the structures correspond to the first preferred embodiment of the present invention described above. And FIGS. 11(e) and 11(f) illustrate unit cells, of which the structures correspond to the second preferred embodiment of the present invention described above. For the sake of simplicity, any component having the same function as its counterpart shown in FIG. 1(a) or 7(a) is identified by the same reference numeral as its counterpart's and the description thereof will be omitted herein.

As can be seen from FIGS. 11(a) and 11(b), neither the hexagonal unit cell itself nor its elements in a similar shape to the unit cell have equal lengths in the X and Y directions unlike the octagonal unit cells.

For example, the conventional hexagonal unit cell shown in FIG. 11(a) is designed so that one of the diagonals of the hexagon is arranged parallel to the X direction and that the lengths xc and yc of the unit cell and lengths xw and yw of the conductive surface 19s of the source electrode 19 satisfy the following equations:

$$\sqrt{3}xc/2 = yc$$

$$\sqrt{3}xw/2 = yw$$

Meanwhile, the conventional hexagonal unit cell shown in FIG. 11(b) is designed so that one of the diagonals of the hexagon is arranged parallel to the Y direction and that the following equations:

$$\sqrt{3}yc/2 = xc$$

$$\sqrt{3}yw/2 = xw$$

are satisfied.

On the other hand, to realize a similar structure to that of the first preferred embodiment of the present invention, the unit cell may be designed so as to satisfy the following equations and inequalities:

$$\sqrt{3}xc/2 < yc$$

$$\sqrt{3}xw/2 = yw$$

$$xe < ye$$

$$xg = yg$$

as shown in FIG. 11(c), for example. Or with the X and Y axes of the unit cell shown in FIG. 11(c) exchanged with each other, the unit cell may also be designed so as to satisfy the following equations and inequalities:

$$\sqrt{3}yc/2 > xc$$

$$\sqrt{3}yw/2 = xw$$

$$xe < ye$$

$$xg = yg$$

as shown in FIG. 11(d).

Furthermore, to realize a similar structure to that of the second preferred embodiment of the present invention, the unit cell may be designed so as to satisfy the following equations and inequalities:

$$\sqrt{3}xc/2 < yc$$

$$\sqrt{3}xw/2 < yw$$

$$\sqrt{3}xpp/2 = ypp$$

as shown in FIG. 11(e). Or with the X and Y axes of the unit cell shown in FIG. 11(c) exchanged with each other, the unit cell may also be designed so as to satisfy the following equations and inequalities:

$$\sqrt{3}yc/2 > xc$$

$$\sqrt{3}yw/2 > xw$$

$$\sqrt{3}ypp/2 = xpp$$

as shown in FIG. 11(f).

Figure 12:
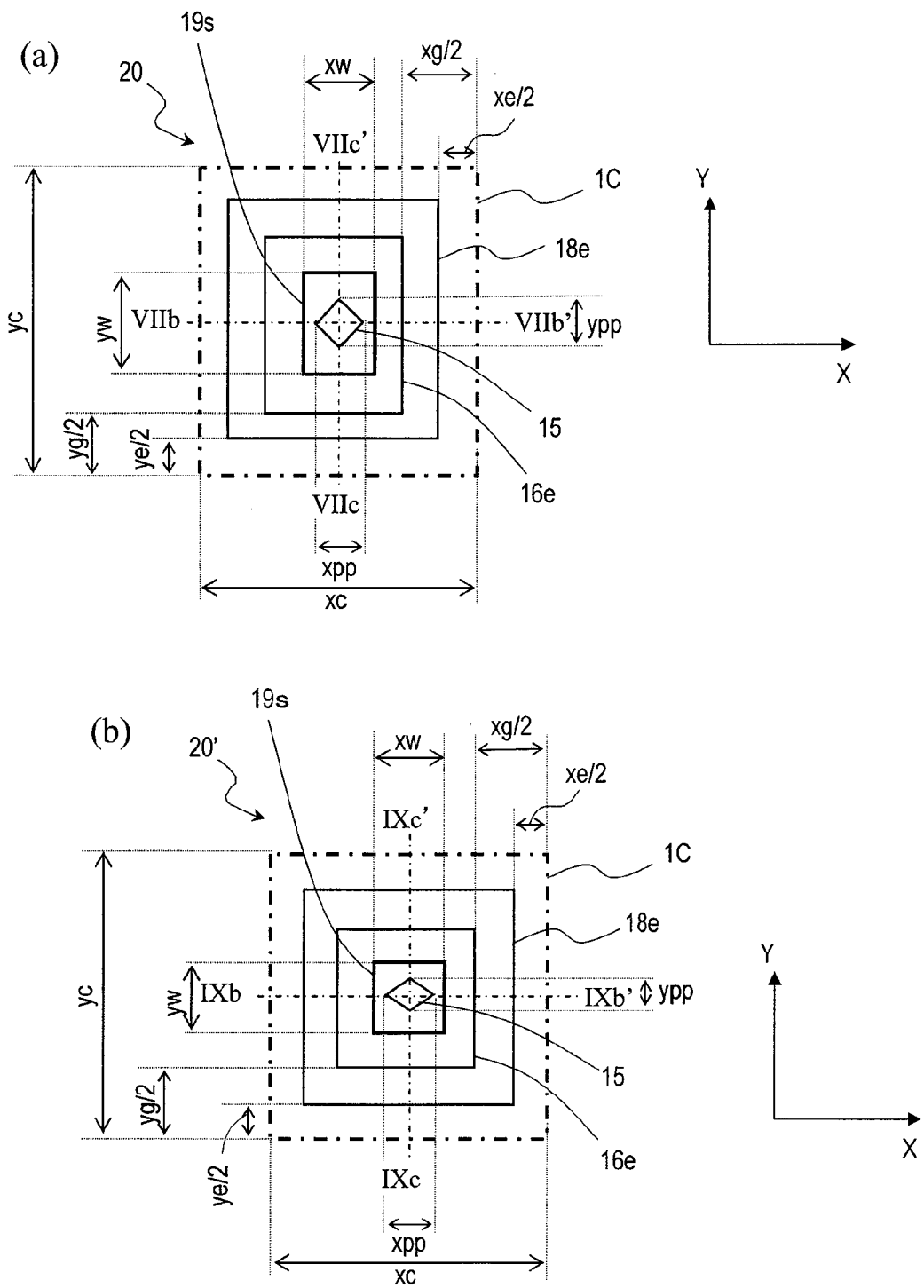
FIGS. 12(a) and 12(b) are schematic plan views illustrating other examples of unit cells according to the second preferred embodiment of the present invention.

In each of the examples described above, in a plan view of the contact region 15, the conductive surface 19s of the source electrode 19, the opening 16e of the channel layer 16, and the opening 18e of the gate electrode 18, their associated sides are parallel to each other. However, the unit cell may also be designed so that among these planar shapes, at least two associated sides form an angle between themselves. For example, as shown in FIGS. 12(a) and 12(b), the unit cell may also be designed to have a contact region 15 in a diamond planar shape, of which each side defines an angle with respect to its associated side of the conductive surface 19s of the source electrode 19. In that case, the lengths xpp and ypp of the contact region 15 as measured in the X and Y directions will be the maximum lengths (i.e., the diagonals of the diamond in this case) in the X and Y directions. In the example illustrated in FIG. 12, the unit cell is also designed so that the difference (yw−ypp) between the respective lengths of the conductive surface 19s of the source electrode 19 and the contact region 15 as measured in the Y direction is greater than their difference (xw−xpp) as measured in the X direction. As a result, the same effect as that of the second preferred embodiment described above will also be achieved.

Also, even if a unit cell that has an elongated shape (e.g., a rectangular shape) in the y direction is designed so that all elements of the unit cell have similar profiles, the same effect as that of the first preferred embodiment described above can also be achieved. However, such a design is impractical because the size of the unit cell would increase significantly in that case.

In the first and second preferred embodiments of the present invention described above, the dielectric film 21 and/or the gate insulating film 17 are/is interposed between the channel layer 16 and the source electrode 19 and/or the interconnect electrode 1C. However, a configuration in which the channel layer 16 is extended both in the X and Y directions to reach the source electrode 19 and the interconnect electrode 1C (i.e., $s_x=0$ and $s_y=0$) may also be adopted.

The preferred embodiments of the present invention described above are implemented as a vertical MOSFET. However, the present invention is also applicable to a MESFET that does not have the gate insulating film 17.

Also, the poly-type of the silicon carbide substrate for use as the semiconductor substrate 11 does not have to be 4H—SiC but could also be any other poly-type. The semiconductor substrate 11 could also be a Si substrate. In that case, a 3C—SiC layer could be formed as the semiconductor layer 12 on the semiconductor substrate 11.

INDUSTRIAL APPLICABILITY

According to the present invention, even if the recognizability of an alignment pattern for use to fabricate a semiconductor device with a semiconductor multilayer structure has decreased so much as to cause a significant misalignment in one direction, various kinds of deterioration in device performance such as short-circuit or contact failure between electrodes and an increase in ON-state resistance can be minimized. Consequently, the present invention provides a highly reliable semiconductor device.

The present invention can be used particularly effectively in a power element that uses SiC such as a vertical MOSFET or MESFET, among other things.

DESCRIPTION OF REFERENCE NUMERALS 10, 20, 20', 500 unit cell
11 semiconductor substrate
12 semiconductor layer
13 p-well region
14 n-type source region
15 p$^+$-type contact region
16 n-type channel layer
16e opening of channel layer
16' semiconductor layer (extra epi-layer)
17 gate insulating film
18 gate electrode
18e opening of gate electrode
19 source electrode
19s conductive surface of source electrode
21 dielectric film
23 drain electrode
24 lower electrode
30 semiconductor device
1C source pad (upper interconnect electrode)
1G gate pad

The invention claimed is:

1. A semiconductor device including a plurality of unit cells formed on an off-cut semiconductor substrate, a principal surface of which is defined by tilting a crystal plane in a predetermined off-cut direction, at least some of the plurality of unit cells each comprising:
   a first semiconductor layer formed on the principal surface of the off-cut semiconductor substrate;
   a first conductive region formed on the surface of the first semiconductor layer and having a first conductivity type;
   a second conductive region formed on the surface of the first semiconductor layer so as to surround the first conductive region and having a second conductivity type that is different from the first conductivity type;
   a second semiconductor layer formed on the first semiconductor layer with an opening that exposes the first and second conductive regions at least partially;
   a first conductor located inside the opening of the second semiconductor layer and having a conductive surface that contacts the first and second conductive regions; and
   a second conductor arranged on the second semiconductor layer and having an opening that exposes the first and second conductive regions at least partially;
   wherein in a plane parallel to the principal surface of the off-cut semiconductor substrate, the following relationships are satisfied:

$t_y > t_x$; and $t_y - t_x > s_y - s_x$ where $t_y$ represents the absolute value of a difference between the respective lengths of the second semiconductor layer and the second conductor as measured in the off-cut direction;
   $t_x$ represents the absolute value of a difference between the respective lengths of the second semiconductor layer and the second conductor as measured perpendicularly to the off-cut direction;
   $s_y$ represents the absolute value of a difference between the respective lengths of the conductive surface of the first conductor and the opening of the second semiconductor layer as measured in the off-cut direction; and
   $s_x$ represents the absolute value of a difference between the respective lengths of the conductive surface of the first conductor and the opening of the second semiconductor layer as measured perpendicularly to the off-cut direction.

2. A semiconductor device including a plurality of unit cells formed on an off-cut semiconductor substrate, a principal surface of which is defined by tilting a crystal plane in a predetermined off-cut direction, at least some of the plurality of unit cells each comprising:
   a first semiconductor layer, formed on the principal surface of the off-cut semiconductor substrate;
   a first conductive region, formed on the surface of the first semiconductor layer and having a first conductivity type;
   a second conductive region formed on the surface of the first semiconductor layer so as to surround the first conductive region and having a second conductivity type that is different from the first conductivity type;
   a second semiconductor layer formed on the first semiconductor layer with an opening that exposes the first and second conductive regions at least partially;
   a first conductor located inside the opening of the second semiconductor layer and having a conductive surface that contacts the first and second conductive regions; and
   a second conductor arranged on the second semiconductor layer and having an opening that exposes the first and second conductive regions at least partially;
   wherein in a plane parallel to the principal surface of the off-cut semiconductor substrate, the following relationships are satisfied:

$u_y > u_x$; and $u_y - u_x > s_y - s_x$ where $u_y$ represents the absolute value of a difference between the respective lengths of the conductive surface of the first conductor and the first conductive region as measured in the off-cut direction;
   $u_x$ represents the absolute value of a difference between the respective lengths of the conductive surface of the first conductor and the first conductive region as measured perpendicularly to the off-cut direction;
   $s_y$ represents the absolute value of a difference between the respective lengths of the conductive surface of the first conductor and the opening of the second semiconductor layer as measured in the off-cut direction;
   $s_x$ represents the absolute value of a difference between the respective lengths of the conductive surface of the first conductor and the opening of the second semiconductor layer as measured perpendicularly to the off-cut direction.

3. The semiconductor device of claim 1, wherein $s_y$ and $s_x$ are substantially equal to each other.

4. The semiconductor device of claim 1, wherein in the plane parallel to the principal surface of the off-cut semiconductor substrate, the following relationship is satisfied:

$$t_y - t_x > u_y - u_x,$$

where $u_y$ represents the absolute value of a difference between the respective lengths of the conductive surface of the first conductor and the first conductive region as measured in the off-cut direction; and
$u_x$ represents the absolute value of a difference between the respective lengths of the conductive surface of the first conductor and the first conductive region as measured perpendicularly to the off-cut direction.

5. The semiconductor device of claim 2, wherein the following relationship is satisfied:

$$u_y - u_x > v_y - v_x,$$

where $v_y$ represents the absolute value of a difference between the respective lengths of the conductive surface of the first conductor and the opening of the second conductor as measured in the off-cut direction; and
$v_x$ represents the absolute value of a difference between the respective lengths of the conductive surface of the first conductor and the opening of the second conductor as measured perpendicularly to the off-cut direction.

6. The semiconductor device of claim 1, wherein the semiconductor device has a transistor structure and the second semiconductor layer functions as a channel layer.

7. The semiconductor device of claim 1, wherein the first and second semiconductor layers are epitaxial layers.

8. The semiconductor device of claim 1, further comprising an insulating film between the second semiconductor layer and the second conductor.

9. The semiconductor device of claim 8, wherein the first semiconductor layer has the second conductivity type, and
wherein each of the at least some of the plurality of unit cells is electrically connected to the first conductive region and further includes a well region of the first conductivity type, which surrounds the second conductive region on the surface of the first semiconductor layer.

10. The semiconductor device of claim 9, further comprising:
a drain electrode arranged on a side of the off-cut semiconductor substrate opposite to the first semiconductor layer, the drain electrode being electrically connected to the off-cut semiconductor substrate;
a dielectric film arranged over the second conductor; and
an upper interconnect electrode arranged on the dielectric film,
wherein the dielectric film has an opening that exposes the first conductor, and
the upper interconnect electrode is electrically connected to the first conductor through the opening of the dielectric film.

11. The semiconductor device of claim 1, wherein the second semiconductor layer includes silicon carbide.

12. The semiconductor device of claim 1, wherein the first semiconductor layer includes silicon carbide.

13. A semiconductor wafer comprising:
a semiconductor bulk substrate, a principal surface of which is defined by tilting a crystal plane in a predetermined off-cut direction;
a semiconductor layer formed on the semiconductor bulk substrate;
a plurality of semiconductor devices, fabricated using the semiconductor layer; and
an alignment pattern formed on at least a part of the semiconductor layer not covered with the semiconductor devices,
wherein at least some of the plurality of semiconductor devices are each a semiconductor device according to claim 1.

14. A semiconductor device comprising:
an off-cut semiconductor substrate, a principal surface of which is defined by tilting a crystal plane in a predetermined off-cut direction;
a first semiconductor layer formed on the principal surface of the off-cut semiconductor substrate;
a second semiconductor layer formed on the first semiconductor layer with an opening that exposes a portion of the surface of the first semiconductor layer;
a first conductor located inside the opening of the second semiconductor layer and having a conductive surface that contacts the exposed surface of the first semiconductor layer; and
a second conductor arranged on the second semiconductor layer and having an opening that exposes the portion of the surface of the first semiconductor layer;
wherein in a plane parallel to the principal surface of the off-cut semiconductor substrate, the following relationships are satisfied:

$$t_y > t_x; \text{ and}$$

$$t_y - t_x > s_y - s_x,$$

where $t_y$ represents the absolute value of a difference between the respective lengths of the openings of the second semiconductor layer and the second conductor as measured in the off-cut direction;
$t_x$ represents the absolute value of a difference between the respective lengths of the openings of the second semiconductor layer and the second conductor as measured perpendicularly to the off-cut direction;
$s_y$ represents the absolute value of a difference between the respective lengths of the conductive surface of the first conductor and the opening of the second semiconductor layer as measured in the off-cut direction; and
$s_x$ represents the absolute value of the difference between the respective lengths of the conductive surface of the first conductor and the opening of the second semiconductor layer as measured perpendicularly to the off-cut direction.

15. A semiconductor device comprising:
an off-cut semiconductor substrate, a principal surface of which is defined by tilting a crystal plane in a predetermined off-cut direction;
a first semiconductor layer formed on the principal surface of the off-cut semiconductor substrate;
a first conductive region formed on the surface of the first semiconductor layer and having a first conductivity type;
a second conductive region formed on the surface of the first semiconductor layer so as to surround the first conductive region and having a second conductivity type that is different from the first conductivity type;
a second semiconductor layer formed on the first semiconductor layer with an opening that exposes the first and second conductive regions at least partially; and
a conductor located inside the opening of the second semiconductor layer and having a conductive surface that contacts the first and second conductive regions, wherein in a plane parallel to the principal surface of the off-cut semiconductor substrate, the following relationships are satisfied:

$u_y > u_x$; and $u_y - > u_x, s_y - s_x$

Where $u_y$ represents the absolute value of a difference between the respective lengths of the conductive surface of the conductor and the first conductive region as measured in the off-cut direction;

$u_x$ represents the absolute value of a difference between the respective lengths of the conductive surface of the conductor and the first conductive region as measured perpendicularly to the off-cut direction;

$s_y$ represents the absolute value of a difference between the respective lengths of the conductive surface of the conductor and the opening of the second semiconductor layer as measured in the off-cut direction; and $s_x$ represents the absolute value of a difference between the respective lengths of the conductive surface of the conductor and the opening of the second semiconductor layer as measured perpendicularly to the off-cut direction.

16. The semiconductor device of claim 14, wherein $s_y$ and $s_x$ are substantially equal to each other.

17. The semiconductor device of claim 2, wherein $s_y$ and $s_x$ are substantially equal to each other.

18. The semiconductor device of claim 2, wherein the semiconductor device has a transistor structure and the second semiconductor layer functions as a channel layer.

19. The semiconductor device of claim 2, wherein the first and second semiconductor layers are epitaxial layers.

20. The semiconductor device of claim 2, further comprising an insulating film between the second semiconductor layer and the second conductor.

21. The semiconductor device of claim 20, wherein the first semiconductor layer has the second conductivity type, and
wherein each of the at least some of the plurality of unit cells is electrically connected to the first conductive region and further includes a well region of the first conductivity type, which surrounds the second conductive region on the surface of the first semiconductor layer.

22. The semiconductor device of claim 21, further comprising:
a drain electrode arranged on a side of the off-cut semiconductor substrate opposite to the first semiconductor layer, the drain electrode being electrically connected to the off-cut semiconductor substrate;
a dielectric film arranged over the second conductor; and
an upper interconnect electrode arranged on the dielectric film,
wherein the dielectric film has an opening that exposes the first conductor, and
the upper interconnect electrode is electrically connected to the first conductor through the opening of the dielectric film.

23. The semiconductor device of claim 2, wherein the second semiconductor layer includes silicon carbide.

24. The semiconductor device of claim 2, wherein the first semiconductor layer includes silicon carbide.

25. A semiconductor wafer comprising:
a semiconductor bulk substrate, a principal surface of which is defined by tilting a crystal plane in a predetermined off-cut direction;
a semiconductor layer formed on the semiconductor bulk substrate;
a plurality of semiconductor devices formed on the semiconductor layer; and
an alignment pattern formed on at least a part of the semiconductor layer not covered with the semiconductor devices,
wherein at least some of the plurality of semiconductor devices are each a semiconductor device according to claim 2.

26. The semiconductor device of claim 15, wherein $s_y$ and $s_x$ are substantially equal to each other.

* * * * *

UNITED STATES PATENT AND TRADEMARK OFFICE
CERTIFICATE OF CORRECTION

| | | |
|---|---|---|
| PATENT NO. | : 8,124,984 B2 | Page 1 of 1 |
| APPLICATION NO. | : 12/665556 | |
| DATED | : February 28, 2012 | |
| INVENTOR(S) | : Masao Uchida, Kazuya Utsunomiya and Koichi Hashimoto | |

It is certified that error appears in the above-identified patent and that said Letters Patent is hereby corrected as shown below:

Column 28, line 48, "$u_y$->$s_y$-$s_x$" should read -- $u_y$-$u_x$>$s_y$-$s_x$ --;

Column 31, line 7, "$u_y$-> $u_x$ $s_y$-$s_x$" should read -- $u_y$-$u_x$>$s_y$-$s_x$ --; and "Where" should read -- where --.

Signed and Sealed this
Second Day of October, 2012

David J. Kappos
*Director of the United States Patent and Trademark Office*

UNITED STATES PATENT AND TRADEMARK OFFICE
CERTIFICATE OF CORRECTION

PATENT NO. : 8,124,984 B2
APPLICATION NO. : 12/665556
DATED : February 28, 2012
INVENTOR(S) : Masao Uchida, Kazuya Utsunomiya and Koichi Hashimoto It is certified that error appears in the above-identified patent and that said Letters Patent is hereby corrected as shown below:

Column 15, line 50, "$\Delta m\ (=|ye\text{-}yg|\text{-}|xe\text{-}yg|)$" should read
-- $\Delta m\ (=|ye\text{-}yg|\text{-}|xe\text{-}xg|)$ --.

Signed and Sealed this
Sixth Day of November, 2012

David J. Kappos
*Director of the United States Patent and Trademark Office*